(12) United States Patent
Kutz

(10) Patent No.: US 8,130,025 B2
(45) Date of Patent: Mar. 6, 2012

(54) NUMERICAL BAND GAP

(75) Inventor: Harold Kutz, Edmonds, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 156 days.

(21) Appl. No.: 12/104,672

(22) Filed: Apr. 17, 2008

(65) Prior Publication Data
US 2008/0258804 A1 Oct. 23, 2008

Related U.S. Application Data

(60) Provisional application No. 60/912,399, filed on Apr. 17, 2007.

(51) Int. Cl.
*H01L 35/00* (2006.01)
(52) U.S. Cl. ......... 327/513; 327/538; 374/178
(58) Field of Classification Search ............ 327/512, 327/513, 538–540, 542; 374/178
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |

(Continued)

FOREIGN PATENT DOCUMENTS
DE 19710829 A1 9/1998
(Continued)

OTHER PUBLICATIONS
USPTO Notice of Allowance for U.S. Appl. No. 10/238,966 dated Jan. 27, 2009; 4 pages.

(Continued)

*Primary Examiner* — Patrick O'Neill

(57) ABSTRACT

A system includes a bandgap temperature sensor to generate multiple base-emitter voltages. The system also include a controller to detect the base-emitter voltages generated by the bandgap temperature sensor and to generate a bandgap reference voltage according to the multiple base-emitter voltage signals, the bandgap reference voltage having a voltage level that remains substantially constant relative to environmental temperature variations.

20 Claims, 5 Drawing Sheets

U.S. PATENT DOCUMENTS

| | | |
|---|---|---|
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Das |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Kanda |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerphide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosetto |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |

| | | | | | | |
|---|---|---|---|---|---|---|
| 5,438,672 A | 8/1995 | Dey | | 5,633,766 A | 5/1997 | Hase et al. |
| 5,440,305 A | 8/1995 | Signore et al. | | 5,642,295 A | 6/1997 | Smayling |
| 5,451,887 A | 9/1995 | El-Avat et al. | | 5,646,544 A | 7/1997 | Iadanza |
| 5,453,904 A | 9/1995 | Higashiyama et al. | | 5,646,901 A | 7/1997 | Sharpe-Geisler et al. |
| 5,455,525 A | 10/1995 | Ho et al. | | 5,648,642 A | 7/1997 | Miller et al. |
| 5,455,731 A | 10/1995 | Parkinson | | 5,651,035 A | 7/1997 | Tozun |
| 5,455,927 A | 10/1995 | Huang | | 5,652,893 A | 7/1997 | Ben-Meir et al. |
| 5,457,410 A | 10/1995 | Ting | | 5,661,433 A | 8/1997 | LaRosa et al. |
| 5,457,479 A | 10/1995 | Cheng | | 5,663,900 A | 9/1997 | Bhandari et al. |
| 5,463,591 A | 10/1995 | Aimoto et al. | | 5,663,965 A | 9/1997 | Seymour |
| 5,479,603 A | 12/1995 | Stone et al. | | 5,664,199 A | 9/1997 | Kuwahara |
| 5,479,643 A | 12/1995 | Bhaskar et al. | | 5,666,480 A | 9/1997 | Leung et al. |
| 5,479,652 A | 12/1995 | Dreyer et al. | | 5,670,915 A | 9/1997 | Cooper et al. |
| 5,481,471 A | 1/1996 | Naglestad | | 5,673,198 A | 9/1997 | Lawman et al. |
| 5,488,204 A | 1/1996 | Mead et al. | | 5,675,825 A | 10/1997 | Dreyer et al. |
| 5,491,458 A | 2/1996 | McCune et al. | | 5,677,691 A | 10/1997 | Hosticka et al. |
| 5,493,246 A | 2/1996 | Anderson | | 5,680,070 A | 10/1997 | Anderson et al. |
| 5,493,723 A | 2/1996 | Beck et al. | | 5,682,032 A | 10/1997 | Philipp |
| 5,495,077 A | 2/1996 | Miller et al. | | 5,684,434 A | 11/1997 | Mann et al. |
| 5,495,593 A | 2/1996 | Elmer et al. | | 5,684,952 A | 11/1997 | Stein |
| 5,495,594 A | 2/1996 | MacKenna et al. | | 5,686,844 A | 11/1997 | Hull et al. |
| 5,497,119 A | 3/1996 | Tedrow et al. | | 5,687,325 A | 11/1997 | Chang |
| 5,499,192 A | 3/1996 | Knapp et al. | | 5,689,195 A | 11/1997 | Cliff et al. |
| 5,500,823 A | 3/1996 | Martin et al. | | 5,689,196 A | 11/1997 | Schutte |
| 5,517,198 A | 5/1996 | McEwan | | 5,691,664 A | 11/1997 | Anderson et al. |
| 5,519,854 A | 5/1996 | Watt | | 5,691,898 A | 11/1997 | Rosenberg et al. |
| 5,521,529 A | 5/1996 | Agrawal et al. | | 5,694,063 A | 12/1997 | Burlison et al. |
| 5,530,444 A | 6/1996 | Tice et al. | | 5,696,952 A | 12/1997 | Pontarelli |
| 5,530,673 A | 6/1996 | Tobita et al. | | 5,699,024 A | 12/1997 | Manlove et al. |
| 5,530,813 A | 6/1996 | Paulsen et al. | | 5,703,871 A | 12/1997 | Pope et al. |
| 5,537,057 A | 7/1996 | Leong et al. | | 5,706,453 A | 1/1998 | Cheng et al. |
| 5,541,878 A | 7/1996 | LeMoncheck et al. | | 5,708,589 A | 1/1998 | Beauvais |
| 5,542,055 A | 7/1996 | Amini et al. | | 5,708,798 A | 1/1998 | Lynch et al. |
| 5,543,588 A | 8/1996 | Bisset et al. | | 5,710,906 A | 1/1998 | Ghosh et al. |
| 5,543,590 A | 8/1996 | Gillespie et al. | | 5,712,969 A | 1/1998 | Zimmermann et al. |
| 5,543,591 A | 8/1996 | Gillespie et al. | | 5,721,931 A | 2/1998 | Gephardt et al. |
| 5,544,067 A | 8/1996 | Rostoker et al. | | 5,724,009 A | 3/1998 | Collins et al. |
| 5,544,311 A | 8/1996 | Harenberg et al. | | 5,727,170 A | 3/1998 | Mitchell et al. |
| 5,546,433 A | 8/1996 | Tran et al. | | 5,728,933 A | 3/1998 | Schultz et al. |
| 5,546,562 A | 8/1996 | Patel | | 5,729,704 A | 3/1998 | Stone et al. |
| 5,552,725 A | 9/1996 | Ray et al. | | 5,730,165 A | 3/1998 | Philipp |
| 5,552,748 A | 9/1996 | O'Shaughnessy | | 5,732,277 A | 3/1998 | Kodosky et al. |
| 5,554,951 A | 9/1996 | Gough | | 5,734,272 A | 3/1998 | Belot et al. |
| 5,555,452 A | 9/1996 | Callaway et al. | | 5,734,334 A | 3/1998 | Hsieh et al. |
| 5,555,907 A | 9/1996 | Philipp | | 5,737,557 A | 4/1998 | Sullivan |
| 5,557,762 A | 9/1996 | Okuaki et al. | | 5,737,760 A | 4/1998 | Grimmer et al. |
| 5,559,502 A | 9/1996 | Schutte | | 5,745,011 A | 4/1998 | Scott |
| 5,559,996 A | 9/1996 | Fujioka | | 5,748,048 A | 5/1998 | Moyal |
| 5,563,526 A | 10/1996 | Hastings et al. | | 5,748,875 A | 5/1998 | Tzori |
| 5,563,529 A | 10/1996 | Seltzer et al. | | 5,752,013 A | 5/1998 | Christensen et al. |
| 5,564,010 A | 10/1996 | Henry et al. | | 5,754,552 A | 5/1998 | Allmond et al. |
| 5,564,108 A | 10/1996 | Hunsaker et al. | | 5,754,826 A | 5/1998 | Gamal et al. |
| 5,565,658 A | 10/1996 | Gerpheide et al. | | 5,757,368 A | 5/1998 | Gerpheide et al. |
| 5,566,702 A | 10/1996 | Philipp | | 5,758,058 A | 5/1998 | Milburn |
| 5,572,665 A | 11/1996 | Nakabayashi | | 5,761,128 A | 6/1998 | Watanabe |
| 5,572,719 A | 11/1996 | Biesterfeldt | | 5,763,909 A | 6/1998 | Mead et al. |
| 5,574,678 A | 11/1996 | Gorecki | | 5,764,714 A | 6/1998 | Stansell et al. |
| 5,574,852 A | 11/1996 | Bakker et al. | | 5,767,457 A | 6/1998 | Gerpheide et al. |
| 5,574,892 A | 11/1996 | Christensen | | 5,774,704 A | 6/1998 | Williams |
| 5,579,353 A | 11/1996 | Parmenter et al. | | 5,777,399 A | 7/1998 | Shibuya |
| 5,587,945 A | 12/1996 | Lin et al. | | 5,781,030 A | 7/1998 | Agrawal et al. |
| 5,587,957 A | 12/1996 | Kowalczyk et al. | | 5,781,747 A | 7/1998 | Smith et al. |
| 5,590,354 A | 12/1996 | Klapproth et al. | | 5,784,545 A | 7/1998 | Anderson et al. |
| 5,594,388 A | 1/1997 | O'Shaughnessy et al. | | 5,790,957 A | 8/1998 | Heidari |
| 5,594,734 A | 1/1997 | Worsley et al. | | 5,796,183 A | 8/1998 | Hourmand |
| 5,594,876 A | 1/1997 | Getzlaff et al. | | 5,799,176 A | 8/1998 | Kapusta et al. |
| 5,594,890 A | 1/1997 | Yamaura et al. | | 5,801,958 A | 9/1998 | Dangelo et al. |
| 5,600,262 A | 2/1997 | Kolze | | 5,802,073 A | 9/1998 | Platt |
| 5,604,466 A | 2/1997 | Dreps et al. | | 5,802,290 A | 9/1998 | Casselman |
| 5,608,892 A | 3/1997 | Wakerly | | 5,805,792 A | 9/1998 | Swoboda et al. |
| 5,614,861 A | 3/1997 | Harada | | 5,805,897 A | 9/1998 | Glowny |
| 5,625,316 A | 4/1997 | Chambers et al. | | 5,808,883 A | 9/1998 | Hawkes |
| 5,625,583 A | 4/1997 | Hyatt | | 5,811,987 A | 9/1998 | Ashmore, Jr. et al. |
| 5,629,857 A | 5/1997 | Brennan | | 5,812,698 A | 9/1998 | Platt et al. |
| 5,629,891 A | 5/1997 | LeMoncheck et al. | | 5,818,254 A | 10/1998 | Agrawal et al. |
| 5,630,052 A | 5/1997 | Shah | | 5,818,444 A | 10/1998 | Alimpich et al. |
| 5,630,057 A | 5/1997 | Hait | | 5,818,736 A | 10/1998 | Leibold |
| 5,630,102 A | 5/1997 | Johnson et al. | | 5,819,028 A | 10/1998 | Manghirmalani et al. |
| 5,631,577 A | 5/1997 | Freidin et al. | | 5,822,387 A | 10/1998 | Mar |

| Patent No. | Date | Inventor |
|---|---|---|
| 5,822,531 A | 10/1998 | Gorczyca et al. |
| 5,828,693 A | 10/1998 | Mays et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Higashino |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson, II et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,917,356 A | 6/1999 | Casal et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,148 A | 7/1999 | Bjorksten et al. |
| 5,930,150 A | 7/1999 | Cohen et al. |
| 5,931,959 A | 8/1999 | Kwiat |
| 5,933,023 A | 8/1999 | Young |
| 5,933,356 A | 8/1999 | Rostoker et al. |
| 5,933,816 A | 8/1999 | Zeanah et al. |
| 5,935,233 A | 8/1999 | Jeddeloh |
| 5,935,266 A | 8/1999 | Thumhofer et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,949,632 A | 9/1999 | Barreras, Sr. et al. |
| 5,952,888 A | 9/1999 | Scott |
| 5,956,279 A | 9/1999 | Mo et al. |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | McDonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |
| 5,983,277 A | 11/1999 | Heile et al. |
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,999,725 A | 12/1999 | Barbier et al. |
| 6,002,268 A | 12/1999 | Sasaki et al. |
| 6,002,398 A | 12/1999 | Wilson |
| 6,003,054 A | 12/1999 | Oshima et al. |
| 6,003,107 A | 12/1999 | Ranson et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,014,723 A | 1/2000 | Tremblay et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Giliespie et al. |
| 6,028,959 A | 2/2000 | Wang et al. |
| 6,031,365 A | 2/2000 | Sharpe-Geisler |
| 6,032,268 A | 2/2000 | Swoboda et al. |
| 6,034,538 A | 3/2000 | Abramovici |
| 6,035,320 A | 3/2000 | Kiriaki et al. |
| 6,037,807 A | 3/2000 | Wu et al. |
| 6,038,551 A | 3/2000 | Barlow et al. |
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,055,584 A | 4/2000 | Bridges et al. |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,803 A | 6/2000 | Allmond et al. |
| 6,075,941 A | 6/2000 | Itoh et al. |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |

| | | | | | | |
|---|---|---|---|---|---|---|
| 6,107,882 A | 8/2000 | Gabara et al. | | 6,240,375 B1 | 5/2001 | Sonoda |
| 6,110,223 A | 8/2000 | Southgate et al. | | 6,246,258 B1 | 6/2001 | Lesea |
| 6,111,431 A | 8/2000 | Estrada | | 6,246,410 B1 | 6/2001 | Bergeron et al. |
| 6,112,264 A | 8/2000 | Beasley et al. | | 6,249,167 B1 | 6/2001 | Oguchi et al. |
| 6,121,791 A | 9/2000 | Abbott | | 6,249,447 B1 | 6/2001 | Boylan et al. |
| 6,121,805 A | 9/2000 | Thamsirianunt et al. | | 6,253,250 B1 | 6/2001 | Evans et al. |
| 6,121,965 A | 9/2000 | Kenney et al. | | 6,253,754 B1 | 7/2001 | Ward |
| 6,125,416 A | 9/2000 | Warren | | 6,262,717 B1 | 7/2001 | Donohue et al. |
| 6,130,548 A | 10/2000 | Koifman | | 6,263,302 B1 | 7/2001 | Hellestrand et al. |
| 6,130,551 A | 10/2000 | Agrawal et al. | | 6,263,339 B1 | 7/2001 | Hirsch |
| 6,130,552 A | 10/2000 | Jefferson et al. | | 6,263,484 B1 | 7/2001 | Yang |
| 6,133,773 A | 10/2000 | Garlepp et al. | | 6,271,679 B1 | 8/2001 | McClintock et al. |
| 6,134,181 A | 10/2000 | Landry | | 6,272,646 B1 | 8/2001 | Rangasayee |
| 6,134,516 A | 10/2000 | Wang et al. | | 6,275,117 B1 | 8/2001 | Abugharbieh et al. |
| 6,137,308 A | 10/2000 | Nayak | | 6,278,568 B1 | 8/2001 | Cloke et al. |
| 6,140,853 A | 10/2000 | Lo | | 6,280,391 B1 | 8/2001 | Olson et al. |
| 6,141,376 A | 10/2000 | Shaw | | 6,281,753 B1 | 8/2001 | Corsi et al. |
| 6,141,764 A | 10/2000 | Ezell | | 6,282,547 B1 | 8/2001 | Hirsch |
| 6,144,327 A | 11/2000 | Distinti et al. | | 6,282,551 B1 | 8/2001 | Anderson et al. |
| 6,148,104 A | 11/2000 | Wang et al. | | 6,286,127 B1 | 9/2001 | King et al. |
| 6,148,441 A | 11/2000 | Woodward | | 6,288,707 B1 | 9/2001 | Philipp |
| 6,149,299 A | 11/2000 | Aslan et al. | | 6,289,300 B1 | 9/2001 | Brannick et al. |
| 6,150,866 A | 11/2000 | Eto et al. | | 6,289,478 B1 | 9/2001 | Kitagaki |
| 6,154,064 A | 11/2000 | Proebsting | | 6,289,489 B1 | 9/2001 | Bold et al. |
| 6,157,024 A | 12/2000 | Chapdelaine et al. | | 6,292,028 B1 | 9/2001 | Tomita |
| 6,157,270 A | 12/2000 | Tso | | 6,294,932 B1 | 9/2001 | Watarai |
| 6,161,199 A | 12/2000 | Szeto et al. | | 6,294,962 B1 | 9/2001 | Mar |
| 6,166,367 A | 12/2000 | Cho | | 6,298,320 B1 | 10/2001 | Buckmaster et al. |
| 6,166,960 A | 12/2000 | Marneweck et al. | | 6,304,014 B1 | 10/2001 | England et al. |
| 6,167,077 A | 12/2000 | Ducaroir | | 6,304,101 B1 | 10/2001 | Nishihara |
| 6,167,364 A | 12/2000 | Stellenberg et al. | | 6,304,790 B1 | 10/2001 | Nakamura et al. |
| 6,167,559 A | 12/2000 | Furtek et al. | | 6,307,413 B1 | 10/2001 | Dalmia et al. |
| 6,169,383 B1 | 1/2001 | Johnson | | 6,310,521 B1 | 10/2001 | Dalmia |
| 6,172,428 B1 | 1/2001 | Jordan | | 6,310,611 B1 | 10/2001 | Caldwell |
| 6,172,571 B1 | 1/2001 | Moyal et al. | | 6,311,149 B1 | 10/2001 | Ryan et al. |
| 6,173,419 B1 | 1/2001 | Barnett | | 6,314,530 B1 | 11/2001 | Mann |
| 6,175,914 B1 | 1/2001 | Mann | | 6,320,184 B1 | 11/2001 | Winklhofer et al. |
| 6,175,949 B1 | 1/2001 | Gristede et al. | | 6,320,282 B1 | 11/2001 | Caldwell |
| 6,181,163 B1 | 1/2001 | Agrawal et al. | | 6,321,369 B1 | 11/2001 | Heile et al. |
| 6,183,131 B1 * | 2/2001 | Holloway et al. ............. 374/172 | | 6,323,846 B1 | 11/2001 | Westerman et al. |
| 6,185,127 B1 | 2/2001 | Myers et al. | | 6,324,628 B1 | 11/2001 | Chan |
| 6,185,450 B1 | 2/2001 | Seguine et al. | | 6,326,859 B1 | 12/2001 | Goldman et al. |
| 6,185,522 B1 | 2/2001 | Bakker | | 6,332,137 B1 | 12/2001 | Hori et al. |
| 6,185,703 B1 | 2/2001 | Guddat et al. | | 6,332,201 B1 | 12/2001 | Chin et al. |
| 6,185,732 B1 | 2/2001 | Mann et al. | | 6,337,579 B1 | 1/2002 | Mochida |
| 6,188,228 B1 | 2/2001 | Philipp | | 6,338,109 B1 | 1/2002 | Snyder et al. |
| 6,188,241 B1 | 2/2001 | Gauthier et al. | | 6,339,815 B1 | 1/2002 | Feng et al. |
| 6,188,381 B1 | 2/2001 | van der Wal et al. | | 6,342,907 B1 | 1/2002 | Petty et al. |
| 6,188,391 B1 | 2/2001 | Seely et al. | | 6,345,383 B1 | 2/2002 | Ueki |
| 6,188,975 B1 | 2/2001 | Gay | | 6,347,395 B1 | 2/2002 | Payne et al. |
| 6,191,603 B1 | 2/2001 | Muradali et al. | | 6,351,789 B1 | 2/2002 | Green |
| 6,191,660 B1 | 2/2001 | Mar et al. | | 6,353,452 B1 | 3/2002 | Hamada et al. |
| 6,191,998 B1 | 2/2001 | Reddy et al. | | 6,355,980 B1 | 3/2002 | Callahan |
| 6,192,431 B1 | 2/2001 | Dabral et al. | | 6,356,862 B2 | 3/2002 | Bailey |
| 6,198,303 B1 | 3/2001 | Rangasayee | | 6,356,958 B1 | 3/2002 | Lin |
| 6,201,407 B1 | 3/2001 | Kapusta et al. | | 6,356,960 B1 | 3/2002 | Jones et al. |
| 6,201,829 B1 | 3/2001 | Schneider | | 6,359,950 B2 | 3/2002 | Gossmann et al. |
| 6,202,044 B1 | 3/2001 | Tzori | | 6,362,697 B1 | 3/2002 | Pulvirenti |
| 6,204,687 B1 | 3/2001 | Schultz et al. | | 6,366,174 B1 | 4/2002 | Berry et al. |
| 6,205,574 B1 | 3/2001 | Dellinger et al. | | 6,366,300 B1 | 4/2002 | Ohara et al. |
| 6,208,572 B1 | 3/2001 | Adams et al. | | 6,366,874 B1 | 4/2002 | Lee et al. |
| 6,211,708 B1 | 4/2001 | Klemmer | | 6,366,878 B1 | 4/2002 | Grunert |
| 6,211,715 B1 | 4/2001 | Terauchi | | 6,369,660 B1 | 4/2002 | Wei |
| 6,211,741 B1 | 4/2001 | Dalmia | | 6,371,878 B1 | 4/2002 | Bowen |
| 6,215,352 B1 | 4/2001 | Sudo | | 6,373,954 B1 | 4/2002 | Malcolm et al. |
| 6,216,254 B1 | 4/2001 | Pesce et al. | | 6,374,370 B1 | 4/2002 | Bockhaus et al. |
| 6,219,729 B1 | 4/2001 | Keats et al. | | 6,377,009 B1 | 4/2002 | Philipp |
| 6,222,528 B1 | 4/2001 | Gerpheide et al. | | 6,377,575 B1 | 4/2002 | Mullaney et al. |
| 6,223,144 B1 | 4/2001 | Barnett et al. | | 6,377,646 B1 | 4/2002 | Sha |
| 6,223,147 B1 | 4/2001 | Bowers | | 6,380,811 B1 | 4/2002 | Zarubinsky et al. |
| 6,223,272 B1 | 4/2001 | Coehlo et al. | | 6,380,929 B1 | 4/2002 | Platt |
| RE37,195 E | 5/2001 | Kean | | 6,380,931 B1 | 4/2002 | Gillespie et al. |
| 6,225,866 B1 | 5/2001 | Kubota et al. | | 6,384,947 B1 | 5/2002 | Ackerman et al. |
| 6,236,242 B1 | 5/2001 | Hedberg | | 6,385,742 B1 | 5/2002 | Kirsh et al. |
| 6,236,275 B1 | 5/2001 | Dent | | 6,388,109 B1 | 5/2002 | Schwarz et al. |
| 6,236,278 B1 | 5/2001 | Olgaard | | 6,388,464 B1 | 5/2002 | Lacey et al. |
| 6,236,593 B1 | 5/2001 | Hong et al. | | 6,396,302 B2 | 5/2002 | New et al. |
| 6,239,389 B1 | 5/2001 | Allen et al. | | 6,396,657 B1 | 5/2002 | Suzuki |
| 6,239,798 B1 | 5/2001 | Ludolph et al. | | 6,397,232 B1 | 5/2002 | Cheng-Hung et al. |

| Patent | Date | Inventor |
|---|---|---|
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamashi/Rab et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 | 4/2003 | Gaston et al. |
| 6,552,933 B2 | 4/2003 | Roohparvar |
| 6,553,057 B1 | 4/2003 | Sha |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B1 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |

| | | |
|---|---|---|
| 6,671,869 B2 | 12/2003 | Davidson et al. |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie |
| 6,750,876 B1 | 6/2004 | Atsatt et al. |
| 6,750,889 B1 | 6/2004 | Livingston et al. |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Muller et al. |
| 6,934,674 B1 | 8/2005 | Douezy et al. |
| 6,937,075 B2 | 8/2005 | Lim et al. |
| 6,940,356 B2 | 9/2005 | McDonald et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |

| | | |
|---|---|---|
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 * | 3/2006 | Scott .............................. 327/535 |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek |
| 7,100,133 B1 | 8/2006 | Melyappan et al. |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Adreade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | McLeod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 7,686,508 B2 * | 3/2010 | Lin et al. ....................... 374/178 |
| 7,766,546 B1 * | 8/2010 | Aslan et al. ................... 374/178 |
| 7,809,545 B2 | 10/2010 | Ciofi et al. |
| 7,880,459 B2 * | 2/2011 | Harvey ........................ 323/313 |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke et al. |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |

| | | | |
|---|---|---|---|
| 2003/0014447 | A1 | 1/2003 | White |
| 2003/0025734 | A1 | 2/2003 | Boose et al. |
| 2003/0033588 | A1 | 2/2003 | Alexander |
| 2003/0041235 | A1 | 2/2003 | Meyer |
| 2003/0056071 | A1 | 3/2003 | Triece et al. |
| 2003/0058469 | A1 | 3/2003 | Buis et al. |
| 2003/0061572 | A1 | 3/2003 | McClannahan et al. |
| 2003/0062889 | A1 | 4/2003 | Ely et al. |
| 2003/0066057 | A1 | 4/2003 | RuDusky |
| 2003/0080755 | A1 | 5/2003 | Kobayashi |
| 2003/0086300 | A1 | 5/2003 | Noyes et al. |
| 2003/0097640 | A1 | 5/2003 | Abrams et al. |
| 2003/0105620 | A1 | 6/2003 | Bowen |
| 2003/0126947 | A1 | 7/2003 | Margaria |
| 2003/0135842 | A1 | 7/2003 | Frey et al. |
| 2003/0149961 | A1 | 8/2003 | Kawai et al. |
| 2003/0229482 | A1 | 12/2003 | Cook et al. |
| 2004/0018711 | A1 | 1/2004 | Madurawe |
| 2004/0054821 | A1 | 3/2004 | Warren et al. |
| 2004/0153802 | A1 | 8/2004 | Kudo et al. |
| 2004/0205553 | A1 | 10/2004 | Hall et al. |
| 2004/0205617 | A1 | 10/2004 | Light |
| 2004/0205695 | A1 | 10/2004 | Fletcher |
| 2005/0024341 | A1 | 2/2005 | Gillespie et al. |
| 2005/0066152 | A1 | 3/2005 | Garey |
| 2005/0143968 | A9 | 6/2005 | Odom et al. |
| 2005/0240917 | A1 | 10/2005 | Wu |
| 2005/0248534 | A1 | 11/2005 | Kehlstadt |
| 2005/0280453 | A1 | 12/2005 | Hsieh |
| 2006/0015862 | A1 | 1/2006 | Odom et al. |
| 2006/0031768 | A1 | 2/2006 | Shah et al. |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2007/0258458 | A1 | 11/2007 | Kapoor |
| 2008/0086668 | A1 | 4/2008 | Jefferson et al. |
| 2008/0095213 | A1 | 4/2008 | Lin et al. |
| 2008/0186052 | A1 | 8/2008 | Needham et al. |
| 2008/0259998 | A1* | 10/2008 | Venkataraman et al. ..... 374/170 |
| 2008/0294806 | A1 | 11/2008 | Swindle et al. |
| 2009/0066427 | A1 | 3/2009 | Brennan |
| 2009/0322305 | A1 | 12/2009 | De Cremoux |

FOREIGN PATENT DOCUMENTS

| | | | |
|---|---|---|---|
| EP | 0308583A2 | A1 | 3/1989 |
| EP | 368398 | A1 | 5/1990 |
| EP | 0450863A2 | A1 | 10/1991 |
| EP | 0499383A2 | A1 | 8/1992 |
| EP | 0639816A2 | A1 | 2/1995 |
| EP | 1170671A1 | A1 | 1/2002 |
| EP | 1205848 | A1 | 5/2002 |
| EP | 1191423A2 | A1 | 2/2003 |
| JP | 404083405 | A1 | 3/1992 |
| JP | 405055842 | A1 | 3/1993 |
| JP | 06021732 | A1 | 1/1994 |
| JP | 404095408 | A1 | 3/2002 |
| WO | 9532478 | A1 | 11/1995 |
| WO | PCT/US96/17305 | A1 | 6/1996 |
| WO | PCT/US98/34376 | A1 | 8/1998 |
| WO | PCT/US99/09712 | A1 | 2/1999 |

OTHER PUBLICATIONS

USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Advisory Action for U.S. Appl. No. 10/001,477 dated Oct. 10, 2008; 3 pages.
"An Analog PPL-Based Clock and Data Recovery Circuit with High Input Jitter Tolerance;" Sun, Reprinted from IEEE Journal of Solid-State Circuits, 1989; 4 pages.
"WP 3.5: An Integrated Time Reference;" Blauschild, Digest of Technical Papers, 1994; 4 pages.
"Micropower CMOS Temperature Sensor with Digital Output;" Bakker et al., IEEE Journal of Solid-State Circuits, 1996; 3 pages.
U.S. Appl. No. 09/964,991: "A Novel Band-Gap Circuit for Providing an Accurate Reference Voltage Compensated for Process State, Process Variations and Temperature," Kutz at al., filed Sep. 26, 2001; 25 pages.
U.S. Appl. No. 09/842,966: "Precision Crystal Oscillator Circuit Used in Microcontroller," Monte Mar, filed Apr. 25, 2001; 28 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.

USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6. 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block," Monte Mar, filed Aug. 29, 2001; 46 pages.
U.S. Appl. No. 10/238,966: "Method for Parameterizing a User Module," Perrin et al., filed Sep. 9, 2002; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator," Monte Mar, filed Dec. 9, 1998; 23 pages.
USPTO Notice of Allowance for U.S. Appl. No. 10/001,477 dated May 8, 2009; 6 pages.
Goodenough, F. "Analog Counterparts of FPGAS Ease System Design" Electronic Design, Penton Publishing, Cleveland, OH, US vol. 42, No. 21, Oct. 14, 1994; 10 pages.
Harbaum, T. et al. "Design of a Flexible Coprocessor Unit" Proceedings of the Euromicro Conference, XX XX, Sep. 1999; 10 pages.
USPTO U.S. Appl. No. 09/924,734: "Programmable Microcontroller (PsoC) Architecture (Mixed Analog/Digital)"; Snyder et al., filed on Aug. 7, 2001; 28 pages.
USPTO U.S. Appl. No. 09/909,045: "Digital Configurable Macro Architecture," Warren Snyder, filed on Jul. 18, 2001; 37 pages.
USPTO U.S. Appl. No. 09/909,109: "Configuring Digital Functions in a Digital Configurable Macro Architecture," Warren Snyder, filed on Jul. 18, 2001; 38 pages.
USPTO U.S. Appl. No. 09/909,047: "A Programmable Analog System Architecture," Monte Mar, filed on Jul. 18, 2001; 60 pages.
USPTO U.S. Appl. No. 09/930,021: "Programmable Methodology and Architecture for a Programmable Analog System"; Mar et al., filed on Aug. 14, 2001; 87 pages.
USPTO U.S. Appl. No. 09/969,311: "Method for Synchronizing and Resetting Clock Signals Supplied to Multiple Programmable Analog Blocks," Bert Sullam, filed on Oct. 1, 2001; 57 pages.
USPTO U.S. Appl. No. 09/875,599: "Method and Apparatus for Programming a Flash Memory," Warren Snyder, filed on Jun. 5, 2001; 23 pages.
USPTO U.S. Appl. No. 09/975,115: "In-System Chip Emulator Architecture," Snyder et al., filed on Oct. 10, 2001; 38 pages.
USPTO U.S. Appl. No. 09/953,423: "A Configurable input/Output Interface for a Microcontroller," Warren Snyder, filed on Sep. 14, 2001; 28 pagesI.
USPTO U.S. Appl. No. 09/893,050: "Multiple Use of Microcontroller Pad," Kutz et al., filed on Jun. 26, 2001; 21 pages.
USPTO U.S. Appl. No. 09/929,891: "Programming Architecture for a Programmable Analog System," Mar et al., filed on Aug. 14, 2001; 82 pages.
USPTO U.S. Appl. No. 09/969,313: "Architecture for Synchronizing and Resetting Clock Signals Supplied to Multiple Analog Programmable Analog Blocks," Bert Sullam, filed on Oct. 1, 2001; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al., "Microcontrollers", 1992, McGraw-Hill; 11 pages.
Ganapathy et al., "Hardware Emulation for Functional Verification of K5", Jun. 1996, 33rd Design Automation Conference Proceedings, Jun. 3-7, 1996; 4 pages.

The U.S. Appl. No. 60/243,708 "Advanced Programmable Microcontroller Device"; Snyder et al., filed Oct. 26, 2000; 277 pages.
"Webster's Third New International Dictionary", 1996, G. & C. Merriam Company; 3 pages (including pp. 1328-1329).
USPTO Advisory Action for U.S. Appl. No. 09/998,848 dated Sep. 7, 2005; 3 pages.
USPTO U.S. Appl. No. 09/957,084: "A Crystal-Less Oscillator with Trimmable Analog Current Control for Increased Stability," Mar et al., filed Sep. 19, 2001; 28 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed Oct. 25, 2001; 49 pages.
USPTO U.S. Appl. No. 09/972,319: "Method for Applying Instructions to Microprocessor in Test Mode," Warren Snyder, filed Oct. 5, 2001; 31 pages.
USPTO U.S. Appl. No. 09/972,003: "Test Architecture for Microcontroller Providing for a Serial Communication Interface," Warren Snyder, filed Oct. 5, 2001; 32 pages.
USPTO U.S. Appl. No. 09/972,133: "Method for Entering Circuit Test Mode," Warren Snyder, filed Oct. 5, 2001; 30 pages.
USPTO U.S. Appl. No. 09/973,535: "Architecture for Decimation Algorithm," Warren Snyder, filed Oct. 9, 2001; 26 pages.
USPTO U.S. Appl. No. 09/977,111: "A Frequency Doubler Circuit with Trimmable Current Control," Shutt et al., filed Oct. 11, 2001; 35 pages.
USPTO U.S. Appl. No. 10/272,231: "Digital Configurable Macro Architecture," Warren Snyder, filed Oct. 15, 2002; 36 pages.
USPTO U.S. Appl. No. 11/125,554: "A Method for a Efficient Supply to a Microcontroller," Kutz at al., filed May 9, 2005; 1 page.
USPTO U.S. Appl. No. 09/855,868: "Protecting Access to Microcontroller Memory Blocks," Warren Snyder, filed May 14, 2001; 28 pages.
USPTO U.S. Appl. No. 09/887,923: "Novel Method and System for interacting between a Processor and a Power on Reset to Dynamically Control Power States in a Microcontroller," Kutz et al., filed Jun. 22, 2001; 44 pages.
USPTO U.S. Appl. No. 10/000,383: "System and Method of Providing a Programmable Clock Architecture for an Advanced Microcontroller," Sullam et al., filed Oct. 24, 2001; 34 pages.
USPTO U.S. Appl. No. 10/001,477: "Breakpoint Control in an In-Circuit Emulation System," Roe et al., filed Nov. 1, 2001; 43 pages.
USPTO U.S. Appl. No. 10/004,197: "In-Circuit Emulator with Gatekeeper Based Halt Control," Nemecek at al., filed Nov. 14, 2001; 47 pages.
USPTO U.S. Appl. No. 10/004,039: "In-Circuit Emulator with Gatekeeper for Watchdog Timer," Nemecek et al., filed Nov. 14, 2001; 46 pages.
USPTO U.S. Appl. No. 10/002,217: "Conditional Branching in an In-Circuit Emulation System," Craig Nemecek, filed Nov. 1, 2001; 43 pages.
USPTO U.S. Appl. No. 10/001,568: "Combined In-Circuit Emulator and Programmer," Nemecek at al., filed Nov. 1, 2001; 47 pages.
USPTO U.S. Appl. No. 10/001,478: "In-Circuit Emulator and Pod Synchronized Boot," Nemecek at al., filed Nov. 1, 2001; 44 pages.
USPTO U.S. Appl. No. 09/887,955: "Novel Power on Reset Circuit for Microcontroller," Kutz et al., filed Jun. 22, 2001; 42 pages.
USPTO U.S. Appl. No. 09/826,397: "Method and Circuit for Allowing a Microprocessor to Change its Operating Frequency on-the-Fly," Bert Sullam, filed Apr. 2, 2001; 24 pages.
USPTO U.S. Appl. No. 09/893,048: "A Microcontroller having an On-Chip High Gain Amplifier," Kutz et al., filed Jun. 26, 2001; 22 pages.
USPTO U.S. Appl. No. 09/912,768: "A Microcontroller having a Dual Mode Relax Oscillator that is Trimmable," James Shutt; filed Jul. 24, 2001; 33 pages.
USPTO U.S. Appl. No. 09/922,419: "A Power Supply Pump Circuit for a Microcontroller," Kutz et al., filed Aug. 3, 2001; 38 pages.
USPTO U.S. Appl. No. 09/922,579: "A Method for a Efficient Supply to a Microcontroller," Kutz et al., filed Aug. 3, 2001; 37 pages.

USPTO U.S. Appl. No. 09/923,461: "Non-Interfering Multiply-Mac (Multiply Accumulate) Circuit," Warren Snyder, filed Aug. 6, 2001; 25 pages.
USPTO U.S. Appl. No. 09/935,454: "Method and Apparatus for Local and Global Power Management in a Programmable Analog Circuit," Monte Mar, filed Aug. 22, 2001; 51 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts-F/Port Product Sheet," undated web page found at http://www.fapo.com/fport.htm; printed on Apr. 12, 2005; 2 pages.
Anonymous, "F/Port:Fast Parallel Port for the PC" Installation Manual Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE 21-23; Jun. 2000; 6 pages.
Hong et al.; "An FPGA-Based Hardware Emulator for Fast Fault Emulation"; IEEE 1997; 4 pages.
Ching et al.; "An In-Curcuit-Emulator for TMS320C25"; IEEE 1994; 6 pages.
Pastermak et al.; "In-Circuit-Emulation in ASIC Architecture Core Designs"; IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers; vol. 8, Issue 2; 8 pages/
Anonymous; "JEENI JTAG EmbeddedICE Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Stallman et al.; "Debugging with GDB the GNU Source-Level Debugger"; Jan. 1994; retrieved on May 2, 2005 from http://www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "Tthe Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
"POD—Piece of Data, Plain Old Documentation, Plain Old Dos . . . "; retrieved on Nov. 14, 2005 from http://www.auditmypc.com/acronym/POD,asp; 2 pages.
USPTO Non-Final Rejection for U.S. Appl. Non 09/989,767 dated Oct. 6, 2004; 15 pages.
USPTO Final Rejection for U.S. Appl. No. 09/989,771 dated Feb. 27, 2007; 8 pages.
USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.

USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for 09/989,765 dated Oct. 2, 2006; 13 pages.
USPTO Non-Final Rejection for U.S. Appl. No. 09/989,765 dated Oct. 5, 2005; 9 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.
USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Circuit Emulators—descriptions of the major ICEs around"; retrieved on Nov. 14, 2005 from http://www.algonet.se/~staffann/developer/emulator.htm; 6 pages.
USPTO U.S. Appl. No. 09/975,104: "Capturing Test/Emulation and Enabling Real-Time Debugging Using FPGA for In-Circuit Emulation," Warren Snyder, filed Oct. 10, 2001; 35 pages.
USPTO Non-Final Rejection for U.S. Appl. No. 09/989,767 dated Jul. 24, 2008; 21 pages.
Anonymous; "Using Debug"; 1999; Prentice-Hail Publishing; 20 pages.
Harrison at al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages (including p. 18).
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
USPTO U.S. Appl. No. 09/975,338: "Method for Breaking Execution of a Test Code in DUT and Emulator Chip Essentially Simultaneously and Handling Complex Breakpoint Events," Nemecek at al., filed Oct. 10, 2001; 34 pages.

USPTO U.S. Appl. No. 09/975,030: "Emulator Chip-Board Architecture for Interface," Snyder et al., filed Oct. 10, 2001; 37 pages.
Wikipedia—Main Page, retrieved on Mar. 8, 2006 from http://en.wikipedia.org/wiki/Main_Page and http://en.wikipedia.org/wiki/Wikipedia:Introduction; 5 pages.
Wikipedia—Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al.; "Emulation of the Sparcie Microprocessor with the MIT Virtual Wires Emulation System"; 1994; IEEE; 9 pages.
Bauer et al.; "A Reconfigurable Logic Machine for Fast Event-Driven Simulation"; Jun. 1998; Design Automation Conference Proceedings; 8 pages.
USPTO U.S. Appli. No. 09/975,105: "Host to FPGA Interface in an In-Circuit Emulation System," Craig Nemecek, filed Oct. 10, 2001; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/989,767 dated Jul. 2, 2007; 22 pages.
USPTO Notice of Allowance for U.S. Appl. No. 09/992,076 dated Mar. 26, 208; 23 pages.
USPTO Notice of Allowance for U.S. Appl. No. 09/992,076 dated Jul. 29, 2008; 6 pages.
UPSTO Advisory Action for U.S. Appl. No. 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for 09/989,767 dated Apr. 6, 2005; 13 pages.

USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 7 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, 18-24 Sep. 2000; 6 pages.
Julio Faura et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.

"PSoC designer: Integrated development environment, getting started 25-minute tutorial, version 1.0", Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com-/t . . . >, Feb. 19, 2001; 21 pages.
Specks et al., "A Mixed Digital-Analog 16B Microcontroller with 0.5MB Flash Memory, On-Chip Power Supply, Physical Newark Interface, and 40V I/O for Automotive Single-Chip Mechatronics," IEEE, Feb. 9, 2000; 1 page.
Hsieh at al., "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008; 3 pages.
USPTO Notice of Allowance for U.S. Appl. No. 09/989,777 dated Sep. 15, 2008; 28 pages.
USPTO Notice of Allowance for U.S. Appl. No. 09/989,777 dated Jul. 7, 2008; 23 pages.
USPTO Final Rejection for U.S. Appl. No. 09/989,777 dated Jan. 30, 2008; 14 pages.
USPTO Non-Final Rejection for U.S. Appl. No. 09/989,777 dated Sep. 11, 2007; 18 pages.
USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006; 21 pages.
USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for U.S. Appl. No. 09/994,601 dated Apr. 17, 2008; 24 pages.
USPTO U.S. Appl. No. 10/033,027; "Microcontrollable Programmable System on a Chip," Warren Snyder; filed Oct. 22, 2001; 117 pages.
USPTO U.S. Appl. No. 10/803,030: "Programmable Microcontrollable Architecture (Mixed Analog/Digital)," Snyder et al., filed Mar. 16, 2004; 13 pages.
USPTO Notice of Allowance for U.S. Appl No. 09/930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 091953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
UPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.

USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchal System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et at "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," 1999, IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang at al,, "Integrated circuit for automatically varying resistance in computer system, has pair of transistors connected in parallel with respective resistors such that resistors are bypassed when corresponding transistors are enabled," Derwent information Ltd; 2002; 2 pages.
Morrison, "IBM Eyes Merchant Packaging Services," Jul. 13, 1998; Electronic News <http://www.findarticles.com>; 4 pages.
Charles, Jr. et al,, "Wirebonding: Reinventing the Process for MCMs," Apr. 1998; IEEE 7th International Conference on Multichip Modules and High Density Packaging; 3 pages.

Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
USPTO U.S. Appl. No. 09/989,815: "A Data Driven Method and System for Monitoring Hardware Resource Usage for Programming an Electric Device," Bartz et al., filed Nov. 19, 2001; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
USPTO U.S. Appl. No. 09/275,336: "Programmable Oscillator Scheme," Mar et at, filed Mar. 24, 1999; 25 pages.
USPTO U.S/ Appl. No. 09/721,316: "Programmable Oscillator Scheme," Mar at al., filed Nov. 22, 2000; 26 pages.
USPTO U.S. Appl. No. 10/324,455: "Programmable Oscillator Scheme," Mar et al., filed Dec. 20, 2002; 23 pages.
USPTO U.S. Appl. No. 09/998,859: "A System and a Method for Checking Lock Step Consistency between in Circuit Emulation and a Microcontroller while Debugging Process is in Progress," Craig Nemecek, filed Nov. 15, 2001; 33 pages.
USPTO U.S. Appl. No. 09/998,834: "A System and a Method for Communication between and Ice and a Production Microcontroller while in a Halt State," Craig Nemecek, filed on Nov. 15, 2001; 33 pages.
USPTO U.S. Appl. No. 10/113,065): "System and Method for Automatically Matching Components in a Debugging System," Nemecek et al., filed Mar. 29, 2002; 32 pages.
USPTO U.S. Appl. No. 09/989,574: "Method and System for using a Graphics user Interface for Programming an Electronic Device," Bartz et al., filed Nov. 19, 2001; 43 pages.
USPTO U.S. Appl. No. 09/989,816: "Datasheet Browsing and Creation with Data-Driven Datasheet Tabs within a Microcontroller Design Tool," Bartz at al., filed Nov. 19, 2001; 55 pages.
"New Object Domain R3 Beta Now Available (Build 134)!" Mar. 13, 2001; <http://web.archive.org/web/200100331202605/www.objectdomain.com/domain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.

Microsoft Computer Dictionary "ActiveX" 2002; Microsoft Press; 5th Edition; 3 pages.

Wikipedia "XML" retrieved on Jan. 29, 2007 from http://en.wikipedia.org/wiki/XML; 16 pages.

"VHDL Samples" retrieved on Jan. 29, 2007 from http://www.csee.umbc.edu/helpVHDL/samples/samples.shtml; 10 pages.

Anonymous, "Lotus Notes Faq—How do you generate unique document numbers?" Sep. 19, 1999; retrieved from www.keysolutions.com on Jul. 9, 2008; 1 page.

Ashok Bindra, "Programmable SoC Delivers a New Level Of System Flexibility"; Electronic Design; Nov. 6, 2000; 11 pages.

Cypress MicroSystem, Inc. "Cypress Customer Forums" retrieved from <http://www.cypress.com/forums/messageview>; Nov. 30, 2004; 1 page.

Cypress MicroSystem, Inc. "PsoC Designer: Integrated Development Environment User Guide"; Rev. 1.18; Sep. 8, 2003; 193 pages.

Hamblen, "Rapid Prototyping Using Field-Programmable Logic Devices" Jun. 2000, IEEE; 9 pages.

USPTO Final Rejection for U.S. Appl. No. 09/943,062 dated Apr. 30, 2004; 9 pages.

Snyder et al., "Xilinx's A-to-Z Systems Platform" Cahners Microprocessor, The Insider's Guide to Microprocessor Hardware, Feb. 6, 2001; 6 pages.

"PSoC Technology Completely Changes 8-bit MCU System Design" Cypress MicroSystem, Inc. Feb. 19, 2001; 21 pages.

USPTO Non-Final Rejection for U.S. Appl. No. 09/943,062 dated Dec. 8, 2003; 9 pages.

USPTO Advisory Action for U.S. Appl. No. 09/943,062 dated Sep. 25, 2003; 3 pages.

USPTO Final Rejection for U.S. Appl. No. 09/943,062 dated Jun. 27, 2003; 8 pages.

USPTO Non-Final Rejection for U.S. Appl. No. 09/943,062 dated Jan. 27, 2003; 7 pages.

USPTO Non-Final Rejection for U.S. Appl. No. 09/943,062 dated Sep. 11, 2002; 9 pages.

"PSoC Designer: Integrated Development Environment" User Guide; Revision 1.11; Last Revised Jul. 17, 2001; 109 pages.

Cypress Microsystems, "Cypress Microsystems Unveils Programmable System-on-a-Chip for Embedded Internet, Communications and Consumer Systems;" 2000, <http://www.cypressmicro.comicorporate/CY_Announces_nov_13_2000.html; 3 pages.

Huang et al., Iceberg, an Embedded In-Circuit Emulator Synthesizer for Microcontrollers, Proceedings of the 36th Design Automation Conference Jun. 21-26,1999; 6 pages.

Yoo et al., "Fast Hardware-Software Co-verification by Optimistic Execution of Real Processor," Proceedings of Design, Automation and Test in Europe Conference and Exhibition 2000; 6 pages.

USPTO Advisory Action for U.S. Appl. No. 09/943,062 dated Mar. 27, 2008; 3 pages.

USPTO Final Rejection for U.S. Appl. No. 09/943,062 dated Jan. 18, 2008; 8 pages.

USPTO Non-Final Rejection for U.S. Appl. No. 09/943,062 dated Jun. 22, 2007; 12 pages.

USPTO Miscellaneous Action for U.S. Appl. No. 09/943,062 dated Jan. 30, 2006; 2 pages.

USPTO Notice of Allowance for U.S. Appl. No. 10/113,064 dated Sep. 21, 2006; 7 pages.

USPTO Non-Final Rejection for U.S. Appl. No. 10/113,064 dated Apr. 6, 2006; 19 pages.

USPTO Final Rejection for U.S. Appl. No. 10/113,064 dated Oct. 18, 2005; 22 pages.

USPTO Non-Final Rejection for U.S. Appl. No. 10/113,064 dated Apr. 25, 2005; 15 pages.

USPTO U.S. Appl. No. 10/113,064: "Method and System for Debugging through Supervisory Operating Codes and Self Modifying Codes," Roe et al., filed Mar. 29, 2002; 36 pages.

USPTO U.S. Appl. No. 10/002,726: "Method and Apparatus for Generating Microcontroller Configuration Information," Ogami et al., filed Oct. 24, 2001; 54 pages.

USPTO Notice of Allowance for U.S. Appl. No. 10/002,726 dated Feb. 6, 2007; 7 pages.

USPTO Non-Final Rejection for U.S. Appl. No. 10/002,726 dated Aug. 28, 2006; 10 pages.

USPTO Final Rejection for U.S. Application No. 10/002,726 dated Mar. 27, 2006; 8 pages.

USPTO Final Rejection for U.S. Appl. No. 10/002,726 dated Nov. 30, 2005; 10 pages.

USPTO Non-Final Rejection for U.S. Appl. No. 10/002,726 dated Jun. 10, 2005; 10 pages.

USPTO Non-Final Rejection for U.S. Appl. No. 10/002,726 dated Dec. 13, 2004; 7 pages.

USPTO U.S. Appl. No. 11/818,005: "Techniques for Generating Microcontroller Configuration Information," Ogami et al., filed Jun. 12, 2007; 61 pages.

USPTO Requirement for Restriction/Election for U.S. Appl. No. 11/818,005 dated Jul. 14, 2009; 5 pages.

USPTO U.S. Appl. No. 11/850,260: "Circuit and Method for Improving the Accuracy of a Crystal-less Oscillator Having Dual-Frequency Modes," Wright et al., filed Sep. 5, 2007; 33 pages.

USPTO Non-Final Rejection for U.S. Appl. No. 11/850,260 dated Mar. 6, 2009; 7 pages.

USPTO Non-Final Rejection for U.S. Appl. No. 11/644,100 dated Mar. 9, 2009; 11 pages.

USPTO Advisory Action for U.S. Appl. No. 11/644,100 dated Feb. 9, 2009; 3 pages.

USPTO Final Rejection for U.S. Appl. No. 11/644,100 dated Nov. 18, 2008; 12 pages.

USPTO Non-Final Rejection for U.S. Appl. No. 11/644,100 dated Apr. 14, 2008; 10 pages.

USPTO Notice of Allowance for U.S. Appl. No. 11/415,588 dated Mar. 11, 2008; 6 pages.

USPTO Advisory Action for U.S. Appl. No. 11/415,588 dated Jan. 14, 2008; 3 pages.

USPTO Final Rejection for U.S. Appl. No. 11/415,588 dated Oct. 19, 2007; 8 pages.

USPTO Non-Final Rejection for U.S. Appl. No. 11/415,588 dated Jun. 13, 2007; 8 pages.

USPTO Notice of Allowance for U.S. Appl. No. 12/218,404 dated Mar. 19, 2009; 7 pages.

USPTO Non-Final Rejection for U.S. Appl. No. 12/218,404 dated Sep. 30, 2008; 8 pages.

USPTO U.S. Appl. No. 11/644,100: "Differential-to-single ended signal converter circuit and method," Jonathon Stiff, filed Dec. 21, 2006; 33 pages.

USPTO U.S. Appl. No. 11/415,588: "Voltage Controlled Oscillator Delay Cell and Method," Sivadasan et al., filed May 1, 2006; 24 pages.

USPTO U.S. Appl. No. 12/218,404: "Voltage Controlled Oscillator Delay Cell and Method," Sivadasan et al., filed Jul. 14, 2008; 23 pages.

USPTO Notice of Allowance for U.S. Appl. No. 11/132,894 dated Apr. 26, 2007; 4 pages.

USPTO Non-Final Rejection for U.S. Appl. No. 11/132,894 dated Dec. 19, 2006; 12 pages.

USPTO U.S. Appl. No. 11/132,894: "Open Loop Bandwidth Test Architecture and Method for Phase Locked Loop (PLL)," Jonathon Stiff, filed May 19, 2005; 38 pages.

USPTO Non-Final Rejection for U.S. Appl. No. 11/322,044 dated May 4, 2009; 18 pages.

USPTO Non-Final Rejection for U.S. Appl. No. 11/322,044 dated Nov. 25, 2008; 15 pages.

USPTO Non-Final Rejection for U.S. Appl. No. 11/322,044 dated Apr. 11, 2008; 11 pages.

USPTO Advisory Action for U.S. Appl. No. 11/322,044 dated Nov. 30, 2007; 2 pages.

USPTO Final Rejection for U.S. Appl. No. 11/322,044 dated Sep. 21, 2007; 14 pages.

USPTO Non-Final Rejection for U.S. Appl. No. 11/322,044 dated Apr. 24, 2007; 13 pages.

USPTO U.S. Appl. No. 11/322,044: "Split charge pump PLL architecture," Jonathon Stiff, filed Dec. 28, 2005; 19 pages.

USPTO Notice of Allowance for U.S. Appl. No. 10/305,589 dated Feb. 4, 2005; 5 pages.

USPTO Final Rejection for U.S. Appl. No. 10/305,589 dated Oct. 21, 2004; 7 pages.

USPTO Non-Final Rejection for U.S. Appl. No. 10/305,589 dated Oct. 7, 2003; 6 pages.
USPTO U.S. Appl. No. 10/305,589: "Current Controlled Delay Circuit," Jonathon Stiff, filed Nov. 26, 2002; 18 pages.
USPTO U.S. Appl. No. 09/849,164: "Reduced Static Phase Error CMOS PLL Charge Pump," Jonathon Stiff, filed May 4, 2001; 30 pages.
Maneatis, "Low-Jitter Process-Independent DLL and PLLll Based on Self-Biased Techniques," IEEE Journal of Solid-State Circuits, vol. 31, No. 11, Nov. 1996; 10 pages.
Larsson, "A Feb. 1600-MHz CMOS Clock Recovery PLL with Low-V dd Capability," IEEE Journal of Solid-State Circuits, vol. 34, No, 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Application No. 10/327,217 dated Feb. 10, 2004; 1 page.
USPTO U.S. Appl. No. 10/327,217: "Single Ended Clock Signal Generator Having a Differential Output," Richmond et al., filed Dec. 20, 2002; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb.1, 2006; 5 pages.
USPTO Non-Final Rejection for U.S. Appl. No. 10/871,582 dated Sep. 7, 2005; 7 pages.
USPTO U.S. Appl. No. 10/871,582: "LVDS Input Circuit with Extended Common Mode Range," Reinschmidt et at., filed Jun. 17, 2004; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
USPTO U.S. Appl. No. 09/404,891: "Method, Architecture and Circuitry for Controlling Pulse Width in a Phase and/or Frequency Detector," Scott et al., filed Sep. 24, 1999; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
USPTO U.S. Appl. No. 10/226,911: "Calibration of Integrated Circuit Time Constants," Gehring et al.; filed Aug. 22, 2002; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
USPTO U.S. Appl. No. 09/943,149: "Method for Phase Locking in a Phase Lock Loop," Moyal et al., filed Aug. 30, 2001; 21 pages.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
USPTO U.S. Appl. No. 09/047,595: "Roving Range Control to Limit Receive PLL Frequency of Operation," Paul H. Scott, filed Mar. 29, 1998; 35 pages.

USPTO U.S. Appl. No. 09/216,460: "Circuit and Method for Controlling an Output of a Ring Oscillator," Abugharbieh et al., filed Dec. 18, 1998; 21 pages.
USPTO U.S. Appl. No. 09/471,914: "Reference-Free Clock Generator and Data Recovery PLL," Dalmia et al., filed Dec. 23, 1999; 32 pages.
USPTO U.S. Appl. No. 09/471,576: "Reference-Free Clock Generation and Data Recovery PLL," Kamal Dalmia, filed Dec. 23, 1999; 30 pages.
USPTO U.S. Appl. No. 10/083,442: "Method/Architecture for a Low Gain PLL with Wide Frequency Range," Meyers et al., filed Feb. 26, 2002; 28 pages.
USPTO U.S. Appl. No. 09/470,665: "Digital Phase/Frequency Detector, and Clock Generator and Data Recovery PLL Containing the Same," Kamal Dalmia, filed Dec. 23, 1999; 26 pages.
USPTO U.S. Appl. No. 09/893,161: "Architecture of a PLL with Dynamic Frequency Control on a PLD," Michael T. Moore, filed Jun. 27, 2001; 32 pages.
USPTO U.S. Appl. No. 09/608,753: "PLL Lockout Watchdog," Wilson et al., filed Aug. 24, 2004; 24 pages.
USPTO U.S. Appl. No. 09/398,956: "Frequency Acquisition Rate Control in Phase Lock Loop Circuits," Moyal et al., filed Sep. 17, 1999; 35 pages.
USPTO U.S. Appl. No. 09/747,262: "Linearized Digital Phase-Locked Loop," Williams et al., filed Dec. 22, 2000; 9 pages.
USPTO U.S. Appl. No. 09/981,448: "Oscillator Tuning Method," Lane T. Hauck, filed Oct. 17, 2001; 28 pages.
USPTO U.S. Appl. No. 09/538,989: "Memory Based Phase Locked Loop," Rengarajan S. Krishnan, filed Mar. 30, 2000; 27 pages.
USPTO U.S. Appl. No. 09/048,905: "Programmable Clock Generator," Mann et al., filed Mar. 26, 1998; 42 pages.
USPTO U.S. Appl. No. 08/865,342: "Programmable Clock Generator," Mann et al., filed May 29, 1997; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
USPTO U.S. Appl. No. 10/293,392: "Low Voltage Receiver Circuit and Method for Shifting the Differential input Signals of the Receiver Depending on a Common Mode Voltage of the input Signals," Maher at al., filed Nov. 13, 2002; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. 10/288,003 dated Apr. 7, 2004; 9 pages.
USPTO U.S. Appl. No. 10/288,003: "Low Voltage Differential Signal Driver Circuit and Method," Roper at al,. filed Nov. 4, 2002; 30 pages.
USPTO Notice of Allowance for U.S. Appl. No. 09/989,777 dated Mar. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
USPTO U.S. Appl. No. 11/200,619: "Providing hardware independence to automate code generation of processing device firmware," Snyder et al., filed Aug. 10, 2005; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
USPTO U.S. Appl. No. 11/201,922: "Design model for a hardware device-independent method of defining embedded firmware for programmable systems," McDonald et al., filed Aug. 10, 2005; 31 pages.

USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
USPTO U.S. Appl. No. 11/201,627: "Method and an apparatus to design a processing system using a graphical user interface," Ogami et al., filed Aug. 10, 2005; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
USPTO U.S. Appl. No. 09/989,808: "Automatic generation of application program interfaces, source code, interrupts, and data sheets for microcontroller programming," Bartz et al., filed Nov. 19, 2001; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
USPTO U.S. Appl. No. 10/109,979: "Graphical user interface with logic unifying functions," Anderson et al., filed Mar. 29, 2002; 100 pages.
USPTO U.S. Appl. No. 09/989,781: "System and method for decoupling and iterating resources associated with a module," Ogami et al., filed Nov. 19, 2001; 40 pages.
USPTO U.S. Appl. No. 09/989,775: "User defined names for registers in memory banks derived from configurations," Ogami et al., filed Nov. 19, 2001; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
USPTO U.S. Appl. No. 09/989,819: "System and method for creating a boot file utilizing a boot template," Ogami et al., filed Nov. 19, 2001; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
USPTO U.S. Appl. No. 09/989,761: "Storing of global parameter defaults and using them over two or more design projects," Ogami et al., filed Nov. 19, 2001; 37 pages.
Wang, et at. "Synthesizing Operating System Based Device Drivers in Embedded Systems," Oct. 1-3, 2003; ACM; 8 pages.
Lutovac et al. "Symbolic Computation of Digital Filter Transfer Function Using Matlab," Proceedings of 23rd International Conference on Microelectronics (MIEL 2002), vol. 2 NIS, Yugoslavia; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-ll Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.

PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archiveorg/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT international Written Opinion for PCT/US05/28791, filed Aug. 12, 2005, mailed Mar. 31, 2008; 8 pages.
Kory Hopkins, "Definition;" Jan. 16, 1997; <http://www.cs.sfu.ca/cs/people/GradStudent.html 1 page.
Ebeling et al., "Validating VLSI Circuit Layout by Wirelist Comparison;" Sep. 1983; in proceedings of the IEEE International Conference on Computer Aided Design (ICCAD-83); 2 pages.
"The Gemini Netlist Comparison Project;" <http://www.cs.washington.edu/research/projects/lis/www/gemini/gemini. html> larry@cs.washington.edu; Mar. 19, 2002; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
USPTO U.S. Appl. No. 12/132,527: "System and Method for Performing Next Placements and Pruning of Disallowed Placements for Programming an Integrated Circuit;" Ogami et al., filed Jun. 3, 2008; 44 pages.
USPTO U.S. Appl. No. 12/356,468: "System and Method for Dynamically Generating a Configuration Datasheet," Anderson et al.; filed Jan. 20, 2009; 27 pages.
Written Opinion of the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO U.S. Appl. No. 09/475,879: "Programmable Logic Device," Lacey et al.; filed Dec. 30, 1999; 50 pages.
USPTO U.S. Appl. No. 09/475,808: "Configurable Memory for Programmable Logic Circuits," Lacey et al., filed Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
USPTO U.S. Appl. No. 10/137,497: "Reconfigurable Testing System and Method," Pleis et al.; filed May 1, 2002; 40 pages.
USPTO Non-Final Rejection for U.S. Appl. No. 10/137,497 dated 11/0512004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Application No. 10/137,497 dated Aug. 2, 2006; 21 pages.
USPTO Notice of Allowance for U.S. Appl. No. 10/137,497 dated Jan. 24, 2007; 12 pages.

USPTO Notice of Allowance for U.S. Appl. No. 10/137,497 dated Jul. 20, 2007; 4 pages.
USPTO U.S. Appl. No. 10/653,050: "Method and System for Programming a Memory Device," Snyder et al.; filed Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
USPTO U.S. Appl. No. 10/172,670: "Method and System for Programming a Memory Device," Snyder et al.; filed Jun. 13, 2002; 66 pages.
USPTO U.S. Appl. No. 11/986,338: Reconfigurable Testing System and Method, Pleis et al., filed Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.
USPTO U.S. Appl. No. 11/965,29: "Universal Digital Block Interconnection and Channel Routing," Snyder at al., filed Dec. 27, 2007; 31 pages.
USPTO Notice of Allowance for U.S. Appl. No. 11/986,338 dated May 7, 2009; 1 page.
USPTO U.S. Appl. No. 11/273,708: "Capacitance Sensor Using Relaxation Oscillators," Snyder et ai., filed Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272: "Successive Approximate Capacitance Measurement Circuit;" Warren Snyder, filed Jan. 20, 2006 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/983,291: "Successive Approximate Capacitance Measurement Circuit," Warren Snyder, filed Nov. 7, 2007; 26 pages.
USPTO Non-Final Rejection for U.S. Appl. No. 11/983,291 dated Nov. 7, 2009; 9 pages.
USPTO U.S. Appl. No. 11/698,660: "Configurable Bus," Kutz et al., filed Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO U.S. Appl. No. 11/709,866: "Input/Output Multiplexer Bus," Dennis Sequine, filed Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, 1991, Oxford University Press, Feb. 5, 2007; 20 pages.
Van Ess, David; "Simulating a 555 Timer with PSoC," Cypress Semiconductor Corporation, Application Note AN2286, May 19, 2005; 10 pages.
Cypress Semiconductor Corporation, "Fan Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "CYBC21×34 Data Sheet," CSR User Module, CSR V.1.0; Oct. 6, 2005; 36 pages.
Chapweske, Adam; "The PS/2 Mouse Interface," PS/2 Mouse Interfacing, 2001, retrieved on May 18, 2006; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20×34 Technical Reference Manual (TRM)," PSoC CY8C20×34 TRM, Version 1.0, 2006; 220 pages.
USPTO U.S. Appl. No. 11/166,622: "Touch wake for electronic devices," Beard et al., filed Jun. 23, 2005; 22 pages.
International Written Opinion of the international Searching Authority for International Application No. PCT/US2006109572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
USPTO U.S. Appl. No. 10/024,093: "Configurable Memory for Programmable Logic Circuits," Lacey et al., filed Dec. 18, 2001; 25 pages.
USPTO U.S. Appl. No. 11/088,028: "Method and Circuit for Rapid Alignment of Signals," Moyal et al., filed Nov. 13, 2007; 34 pages.
USPTO Notice of Allowance for U.S. Appl. No. 11/088,028 dated Jul. 2, 2007; 6 pages.
USPTO Notice of Allowance for U.S. Appl. No. 11/088,028 dated Jan. 26, 2007; 6 pages.
USPTO Non-Final Rejection for U.S. Appl. No. 11/088,028 dated Jun. 16, 2006; 8 pages.
USPTO U.S. Appl. No. 11/985,340: "Method and Circuit for Rapid Alignment of Signals," Moyal et al., filed Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
Written Opinion of the International Searching Authority for International Application No. PCT/US08/60696 dated Sep. 22, 2008; 4 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.

Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.

International Search Report of the International Searching Authority for International Application No. PCT/US08/60696 dated Sep. 22, 2008; 2 pages.

International Search Report of the International Searching Authority for International Application No. PCT/US08/60698 dated Sep. 05, 2008; 2 pages.

Shahbahrami et al., "Matrix Register File and Extended Subwords: Two Techniques for Embedded Media Processors," ACM, May 2005; 9 pages.

Jung et al., "A Register File with Transposed Access Mode," 2000, IEEE; 2 pages.

International Search Report of the International Searching Authority for International Application No. PCT/US08/60681 dated Sep. 12, 2008; 2 pages.

Written Opinion of the International Searching Authority for International Application No. PCT/US08/60681 dated Sep. 12, 2008; 4 pages.

USPTO Notice of Allowance for U.S. Appl. No. 11/965,677 dated Sep. 10, 2009; 6 pages.

USPTO Non-Final Rejection for U.S. Appl. No. 11/965,677 dated Mar. 10, 2009; 10 pages.

USPTO Notice of Allowance for U.S. Appl. No. 10/238,966 dated Aug. 5, 2009; 5 pages.

USPTO Notice of Allowance for U.S. Appl. No. 101033,027 dated Sep. 2, 2009; 4 pages.

USPTO Non-Final Rejection for U.S. Appl. No. 10/001,478 dated Aug. 4, 2009; 17 pages.

USPTO Advisory Action for U.S. Appl. No. 10/001,478 dated Jun. 30, 2009; 3 pages.

USPTO Final Rejection for U.S. Appl. No. 10/001,478 dated Apr. 20, 2009; 16 pages.

USPTO Notice of Allowance for U.S. Appl. No. 10/002,217 dated Sep. 17, 2009; 6 pages.

USPTO Notice of Allowance for U.S. Appl. No. 10/002,217 dated Jun. 8, 2009; 8 pages.

USPTO Notice of Allowance for U.S. Appl. No. 10/001,477 dated Dec. 4, 2009; 7 pages.

USPTO Notice of Allowance for U.S. Appl. No. 10/001,477 dated Aug. 26, 2009; 6 pages.

USPTO Ex Parte Quayle Action for U.S. Appl. No. 09/975,115 dated Aug. 20, 2009; 7 pages.

USPTO Non-Final Rejection for U.S. Appl. No. 09/994,601 dated Jul. 9, 2009; 11 pages.

USPTO Non-Final Rejection for U.S. Appl. No. 11/818,005 dated Nov. 23, 2009; 8 pages.

USPTO Requirement for Restriction/Election for U.S. Appl. No. 11/818,005 dated Jul. 14, 2009; 5 pages.

USPTO Advisory Action for U.S. Appl. No. 09/989,778 dated Jun. 17, 2009; 3 pages.

USPTO Notice of Allowance for U.S. Appl. No. 09/994,600 dated Aug. 25, 2009; 4 pages.

USPTO Notice of Allowance for U.S. Appl. No. 09/994,600 dated Apr. 3, 2009; 5 pages.

USPTO Notice of Allowance for U.S. Appl. No. 09/989,762 dated Oct. 30, 2009; 6 pages.

USPTO Notice of Allowance for U.S. Appl. No. 09/989,762 dated Jul. 16, 2009; 6 pages.

USPTO Non-Final Rejection for U.S. Appl. No. 09/998,848 dated May 12, 2009; 16 pages.

USPTO Non-Final Rejection for U.S. Appl. No. 09/989,767 dated May 12, 2009; 21 pages.

USPTO Final Rejection for U.S. Appl. No. 09/989,771 dated Nov. 25, 2009; 12 pages.

USPTO Notice of Allowance for U.S. Appl. No. 09/989,765 dated Sep. 3, 2009; 7 pages.

USPTO Non-Final Rejection for U.S. Appl. No. 09/989,782 dated Oct. 27, 2009; 9 pages.

USPTO Final Rejection for U.S. Appl. No. 09/989,782 dated May 15, 2009; 10 pages.

USPTO Notice of Allowance for U.S. Appl. No. 11/986,338 dated Oct. 19, 2009; 4 pages.

USPTO Notice of Allowance for U.S. Appl. No. 09/989,777 dated Aug. 6, 2009; 8 pages.

USPTO Notice of Allowance for U.S. Appl. No. 10/008,096 dated Oct. 21, 2009; 6 pages.

USPTO Notice of Allowance for U.S. Appl. No. 10/008,096 dated Jun. 5, 2009; 12 pages.

USPTO Notice of Allowance for U.S. Appl. No. 11/985,340 dated Nov. 9, 2009; 7 pages.

USPTO Advisory Action for U.S. Appl. No. 11/201,627 dated Sep. 21, 2009; 3 pages.

USPTO Final Rejection for U.S. Appl. No. 11/201,627 dated Jul. 7, 2009; 19 pages.

USPTO Miscellaneous Action for U.S. Appl. No. 11/201,922 dated Oct. 1, 2009; 2 pages.

USPTO Non-Final Rejection for U.S. Appl. No. 11/200,619 dated Jun. 17, 2009; 12 pages.

USPTO Non-Final Rejection for U.S. Appl. No. 11/166,622 dated Sep. 29, 2009; 11 pages.

USPTO Advisory Action for U.S. Appl. No. 11/166,622 dated May 27, 2009; 3 pages.

USPTO Final Rejection for U.S. Appl. No. 11/166,622 dated Mar. 10, 2009; 11 pages.

USPTO Notice of Allowance for U.S. Appl. No. 12/218,404 dated Nov. 3, 2009; 8 pages.

USPTO Notice of Allowance for U.S. Appl. No. 12/218,404 dated Jul. 10, 2009; 7 pages.

USPTO Notice of Allowance for U.S. Appl. No. 11/709,866 dated Aug. 4, 2009; 7 pages.

USPTO Non-Final Rejection for U.S. Appl. No. 11/698,660 dated Oct. 7, 2009; 12 pages.

USPTO Advisory Action for U.S. Appl. No. 11/698,660 dated Jul. 31, 2009; 3 pages.

USPTO Notice of Allowance for U.S. Appl. No. 11/983,291 dated Oct. 22, 2009; 7 pages.

USPTO Final Rejection for U.S. Appl. No. 11/983,291 dated Aug. 12, 2009; 10 pages.

USPTO Final Rejection for U.S. Appl. No. 11/322,044 dated Oct. 19, 2009; 10 pages.

USPTO Final Rejection for U.S. Appl. No. 11/644,100 dated Aug. 19, 2009; 12 pages.

USPTO Advisory Action for U.S. Appl. No. 11/850,260 dated Nov. 2, 2009; 3 pages.

USPTO Final Rejection for U.S. Appl. No. 11/850,260 dated Aug. 21, 2009; 9 pages.

USPTO Final Rejection for U.S. Appl. No. 09/989,767 dated Dec. 7, 2009; 22 pages.

USPTO Final Rejection for U.S. Appl. No. 11/698,660 dated Feb. 16, 2010; 14 pages.

USPTO Notice of Allowance for U.S. Appl. No. 09/989,765 dated Dec. 22, 2009; 8 pages.

USPTO Notice of Allowance for U.S. Appl. No. 09/994,600 dated Jan. 4, 2010; 4 pages.

USPTO Notice of Allowance for U.S. Appl. No. 10/002,217 dated Jan. 11, 2010; 7 pages.

USPTO Notice of Allowance for U.S. Appl. No. 09/989,777 dated Jan. 15, 2010; 8 pages.

USPTO Notice of Allowance for U.S. Appl. No. 11/965,291 dated Jan. 13, 2010; 4 pages.

USPTO Notice of Allowance for U.S. Appl. No. 09/975,115 dated Jan. 29, 2010; 9 pages.

USPTO Notice of Allowance for U.S. Appl. No. 10/238,966 dated Feb. 1, 2010; 4 pages.

USPTO Final Rejection for U.S. Appl. No. 09/994,601 dated Jan. 5, 2010; 13 pages.

USPTO Non-Final Rejection for U.S. Appl. No. 09/998,848 dated Dec. 10, 2009; 16 pages.

USPTO Notice of Allowance for U.S. Appl. No. 10/008,096 dated Feb. 1, 2010; 6 pages.

USPTO Non-Final Rejection for U.S. Appl. No. 11/201,627 dated Dec. 24, 2009; 22 pages.

USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages..
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Non-Final Rejection for U.S. Appl. No. 10/133,581 dated Feb. 24, 2006; 11 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Non-Final Rejection for U.S. Appl. No. 12/070,547 dated Jun. 3, 2009; 6 pages.
USPTO Final Rejection for U.S. Appl. No. 12/070,547 dated Oct. 30, 2009; 5 pages.
USPTO Notice of Allowance for U.S. Appl. No. 12/070,547 dated Feb. 24, 2010; 4 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Notice of Allowance for U.S. Appl. No. 11/347,189 dated Sep. 27, 2007; 4 pages.
USPTO Non-Final Rejection for U.S. Appl. No. 11/347,189 dated Jun. 8, 2007; 6 pages.
USPTO Non-Final Rejection for U.S. Appl. No. 11/201,922 dated Jun. 11, 2010; 12 pages.
USPTO Notice of Allowance for U.S. Appl. No. 09/943,062 dated Jun. 29, 2010; 4 pages.
USPTO Final Rejection for U.S. Appl. No. 11/818,005 dated May 24, 2010; 8 pages.
USPTO Non-Final Rejection for U.S. Appl. No. 12/132,527 dated Apr. 29, 2010; 7 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 9, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Moods Mano, "Computer System Architecture," 1982, Prentice-Hall, 2nd Edition, pp. 261-264 and 435-440; 14 pages.

Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.

Fred Eady, "PSoC 101," Circuit Cellar, Aug. 2004, accessed Sep. 13, 2005, <http://www.circuitcellar.com/library/print10804/eady169/2.htm>; 4 pages.

USPTO Notice of Allowance for U.S. Appl. No. 10/803,030 dated Jan. 8, 2007; 6 pages.

USPTO Non-Final Rejection for U.S. Appl. No. 10/803,030 dated Jun. 8, 2005; 4 pages.

U.S. Appl. No. 12/058,586: "System and Method for Monitoring a Target Device," Ogami et al., filed Mar. 28, 2008; 41 pages.

U.S. Appl. No. 12/058,534: "System and Method for Controlling a Target Device," Ogami et al., filed Mar. 28, 2008; 40 pages.

U.S. Appl. No. 12/004,833: "Systems and Methods for Dynamically Reconfiguring a Programmable System on a Chip," Ogami et al., filed Dec. 21, 2007; 40 pages.

U.S. Appl. No. 12/058,569: "Configuration of Programmable IC Design Elements," Best et al., filed Mar. 28, 2008; 19 pages.

U.S. Appl. No. 12/057,149: "Power Management Architecture, Method and Configuration System," Kenneth Ogami, filed Mar. 27, 2008; 34 pages.

USPTO Non-Final Rejection for U.S. Appl. No. 12/058,569 dated Aug. 2, 2010; 9 pages.

USPTO Miscellaneous Action for U.S. Appl. No. 10/113,581 dated Jun. 23, 2010; 6 pages.

USPTO Miscellaneous Action for U.S. Appl. No. 10/001,478 dated Feb. 23, 2010; 5 pages.

USPTO Notice of Allowance for U.S. Appl. No. 10/001,478 dated Jun. 2, 2010; 11 pages.

USPTO Notice of Allowance for U.S. Appl. No. 11/985,340 dated Jun. 9, 2010; 8 pages.

USPTO Notice of Allowance for U.S. Appl. No. 11/850,260 dated Jul. 2, 2010; 8 pages.

USPTO Notice of Allowance for U.S. Appl. No. 12/060,128 dated Oct. 19, 2009; 8 pages.

USPTO Miscellaneous Action for U.S. Appl. No. 09/975,338 dated Apr. 30, 2010; 2 pages.

USPTO Advisory Action for U.S. Appl. No. 11/818,005 dated Jul. 30, 2010; 3 pages.

USPTO Non-Final Rejection for U.S. Appl. No. 12/132,527 dated Apr. 29, 2010; 7 pages.

USPTO Advisory Action for U.S. Appl. No. 11/201,627 dated Aug. 5, 2010; 3 pages.

USPTO Final Rejection for U.S. Appl. No. 11/201,627 dated May 24, 2010; 26 pages.

USPTO Non-Final Rejection for U.S. Appl. No. 11/166,622 dated Jun. 22, 2010; 11 pages.

USPTO Final Rejection for U.S. Appl. No. 11/166,622 dated Mar. 18, 2010; 12 pages.

USPTO Non-Final Rejection for U.S. Appl. No. 11/698,660 dated May 21, 2010; 15 pages.

USPTO Advisory Action for U.S. Appl. No. 11/644,100 dated Jul. 21, 2010; 3 pages.

USPTO Final Rejection for U.S. Appl. No. 11/644,100 dated May 29, 2010; 13 pages.

USPTO Final Rejection for U.S. Appl. No. 11/865,672 dated Dec. 30, 2009; 6 pages.

USPTO Final Rejection for U.S. Appl. No. 11/857,947 dated Oct. 14, 2009; 22 pages.

USPTO Non-Final Rejection for U.S. Appl. No. 11/857,947 dated Feb. 3, 2010; 23 pages.

USPTO Non-Final Rejection for U.S. Appl. No. 11/857,947 dated Jul. 21, 2010; 15 pages.

USPTO Non-Final Rejection for U.S. Appl. No. 11/968,145 dated Mar. 4, 2010; 11 pages.

USPTO Final Rejection for U.S. Appl. No. 11/968,145 dated Aug. 2, 2010; 6 pages.

USPTO Non-Final Rejection for U.S. Appl. No. 12/104,678 dated Jul. 2, 2010; 8 pages.

Vixel, "InSpeed SOC 320 Embedded Storage Switch," 2003, Vixel, pp. 1-5; 5 pages.

A.F. Harvey, "DMA Fundamentals on Various PC Platforms," 1991, 1994, National Instruments Corporation, pp. 1-19; 19 pages.

Balough et al., "White Paper: Comparing IP Integration Approaches for FPGA Implementation," Feb. 2007, Version 1.1, Altera, pp. 1-7; 7 pages.

John Mangino, "Using DMA with High Performance Peripherals to Maximize System Performance," 2007, Texas Instruments, pp. 1-23; 23 pages.

USPTO Non-Final Rejection for U.S. Appl. No. 12/060,176 dated Mar. 30, 2010; 22 pages.

The Written Opinion of the International Search Report for International Application No. PCT1US10/33626 mailed Jun. 24, 2010; 5 pages.

International Search Report for International Application No. PCT/US10/33626 mailed Jun. 24, 2010; 3 pages.

U.S. Appl. No. 12/765,400: "Autonomous Control in a Programmable System," Sullam et al., filed Apr. 22, 2010; 30 pages.

USPTO Non-Final Rejection for U.S. Appl. No. 11/698,660 dated Dec. 13, 2010; 20 pages.

USPTO Notice of Allowance for U.S. Appl. No. 11/644,100 dated Jan. 6, 2011; 6 pages.

USPTO Non-Final Rejection for U.S. Appl. No. 11/201,922 dated Dec. 28, 2010; 14 pages.

USPTOFinal Rejection for U.S. Appl. No. 11/166,622 dated Dec. 7, 2010; 12 pages.

USPTO Non-Final Rejection for U.S. Appl. No. 11/166,622 dated Jun. 22, 2010; 11 pages.

USPTO Final Rejection for U.S. Appl. No. 09/989,771 dated Jan. 4, 2011; 12 pages.

USPTO Non-Final Rejection for U.S. Appl. No. 09/975,338 dated 04/30/10; 2 pages.

USPTO Non-Final Rejection for U.S. Appl. No. 11/818,005 dated Oct. 26, 2010; 10 pages.

USPTO Final Rejection for U.S. Appl. No. 12/132527 dated Oct. 14, 2010; 8 pages.

USPTO Non-Final Rejection for U.S. Appl. No. 12/004,833 dated 12/21/10; 8 pages.

USPTO Notice of Allowance for U.S. Appl. No. 12/058,569 dated Dec. 13, 2010; 6 pages.

USPTO Non-Final Rejection for U.S. Appl. No. 09/989,782 dated Oct. 27, 2009; 9 pages.

USPTO Final Rejection for U.S. Appl. No. 12/104,678 dated Dec. 3, 2010; 9 pages.

USPTO Final Rejection for U.S. Appl. No. 11/857,947 dated Jan. 4, 2011; 14 pages.

USPTO Non-Final Rejection for U.S. Appl. No. 11/968,145 dated Jan. 5, 2011; 8 pages.

USPTO Advisory Action for U.S. Appl. No. 09/994,601 dated Mar. 23, 2010; 2 pages.

USPTO Notice of Allowance for U.S. Appl. No. 12/057,149 dated Nov. 30, 2010; 7 pages.

USPTO Final Rejection for U.S. Appl. No. 12/060,176 dated Oct. 12, 2010; 22 pages.

USPTO Notice of Allowance for U.S. Appl. No. 09/998,848 dated Oct. 13, 2010; 4 pages.

USPTO Non-Final Rejection for U.S. Appl. No. 09/998,848 dated Jun. 21, 2010; 15 pages.

USPTO Advisory Action for U.S. Appl. No. 09/998,848 dated Feb. 24, 2010; 3 pages.

USPTO Non-Final Rejection for U.S. Appl. No. 09/989,767 dated Jul. 9, 2010; 22 pages.

USPTO Non-Final Rejection for U.S. Appl. No. 09/989,771 dated Jul. 20, 2010; 12 pages.

USPTO Advisory Action for U.S. Appl. No. 09/989,771 dated Feb. 3, 2010; 3 pages.

USPTO Miscellaneous Action for U.S. Appl. No. 10/113,581 dated Jun. 23, 2010; 6 pages.

USPTO Notice of Allowance for U.S. Appl. No. 10/113,581 dated Sep. 3, 2010; 11 pages.

USPTO Notice of Allowance for U.S. Appl. No. 10/001,478 dated Sep. 7, 2010; 10 pages.

USPTO Non-Final Rejection for U.S. Appl. No. 11/818,005 dated Oct. 26, 2010; 10 pages.

USPTO Final Rejection for U.S. Appl. No. 12/132,527 dated Oct. 14, 2010; 8 pages.
USPTO Non-Final Rejection for U.S. Appl. No. 11/201,627 dated Sep. 30, 2010; 6 pages.
USPTO Final Rejection for U.S. Appl. No. 11/698,660 dated Feb. 3, 2010; 19 pages.
USPTO Advisory Action for U.S. Appl. No. 11/698,660 dated Nov. 10, 2010; 3 pages.
USPTO Non-Final Rejection for U.S. Appl. No. 11/644,100 dated Sep. 15, 2010; 10 pages.
USPTO Non-Final Rejection for U.S. Appl. No. 11/201,922 dated Jun. 11, 2010; 12 pages.
USPTO Final Rejection for U.S. Appl. No. 12/060,176 dated Oct. 12, 2010; 22 pages.
USPTO Non-Final Rejection for U.S. Appl. No. 11/644,100 dated Dec. 16, 2009; 13 pages.
USPTO Final Rejection for U.S. Appl. No. 11/166,622 dated Mar. 18, 2010; 12 pages.
USPTO Non-Final Rejection for U.S. Appl. No. 12/058,534 dated Jan. 11, 2011; 17 pages.
USPTO Non-Final Rejection for U.S. Appl. No. 12/004,833 dated Dec. 21, 2010; 8 pages.
USPTO Requirement Restriction for U.S. Appl. No. 12/004,833 dated Sep. 22, 2010; 6 pages.
U.S. Appl. No. 12/058,586; "System and Method for Monitoring a Target Device," Kenneth Ogami et al. filed Mar. 28, 2008; 56 pages.
USPTO Notice of Allowance for U.S. Appl. No. 10/118,682 dated Apr. 3, 2006; 4 pages.
USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 3, 2004; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for U.S. Appl. No. 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.
USPTO Notice of Allowance for U.S. Appl. No. 09/975,115 dated May 9, 2011; 11 pages.
USPTO Non-Final Rejection for U.S. Appl. No. 10/033,027 dated Mar. 15, 2011; 6 pages.
USPTO Notice of Allowance for U.S. Appl. No. 11/818,005 dated Mar. 23, 2011; 7 pages.
USPTO Requirement Restriction for U.S. Appl. No. 12/356,468 dated Apr. 22, 2011; 7 pages.
U.S. Appl. No. 12/356,468: "System and Method for Dynamically Generating a Configuration Datasheet," Anderson et al., filed Jan. 20, 2009; 69 pages.
USPTO Notice of Allowance for U.S. Appl. No. 09/998,848 dated Feb. 17, 2011; 7 pages.
USPTO Non-Final Rejection for U.S. Appl. No. 12/136,557 dated May 5, 2011; 7 pages.
USPTO Miscellaneous Action for U.S. Appl. No. 09/975,338 dated Apr. 30, 2010; 2 pages.
USPTO Non-Final Rejection for U.S. Appl. No. 12/789,399 dated Mar. 10, 2011; 14 pages.
U.S. Appl. No. 12/789,399: "Model for a Hardware Device-Independent Method of Defining Embedded Firmware for Programmable Systems," McDonald et al., filed May 27, 2010; 32 pages.
USPTO Notice of Allowance for U.S. Appl. No. 11/166,622 dated Apr. 15, 2011; 5 pages.
USPTO Final Rejection for U.S. Appl. No. 11/698,660 dated Apr. 4, 2011; 20 pages.
USPTO Notice of Allowance for U.S. Appl. No. 11/865,672 dated Mar. 2, 2011; 8 pages.
USPTO Notice of Allowance for U.S. Appl. No. 11/857,947 dated Mar. 30, 2011; 8 pages.
USPTO Notice of Allowance for U.S. Appl. No. 12/058,569 dated Apr. 11, 2011; 7 pages.
USPTO Non-Final Rejection for U.S. Appl. No. 12/060,176 dated Apr. 6, 2011; 23 pages.
USPTO Notice of Allowance for U.S. Appl. No. 12/104,672 dated Feb. 14, 2011; 9 pages.
USPTO Advisory Action for U.S. Appl. No. 12/104,678 dated Feb. 16, 2011; 5 pages.

* cited by examiner

NUMERICAL BAND GAP

RELATED APPLICATIONS

This application claims the benefit of U.S. Provisional Application No. 60/912,399, filed Apr. 17, 2007, which is incorporated herein by reference.

TECHNICAL FIELD

This disclosure relates generally to electronic circuits, and more particularly to numerical band gaps.

BACKGROUND

Many electronic circuits include analog temperature sensors to detect the temperature of their environment. These temperature sensors often supply fixed currents to a pair of diodes or bipolar junction transistors operating with different current densities, and then compare the associated base-emitter voltages $V_{BE}$ to determine an environmental temperature. Although these conventional temperature sensors can determine the temperature of their environment, they typically include analog circuit elements, such as operational amplifiers, which occupy a relatively large area on a chip and consume a relatively large amount of power.

SUMMARY

A device includes a bandgap temperature sensor to generate multiple base-emitter voltages, and a system controller to detect the base-emitter voltages generated by the bandgap temperature sensor and to generate a bandgap reference voltage according to the multiple base-emitter voltages. The bandgap reference voltage can have a voltage level that remains substantially constant relative to a temperature associated with the bandgap temperature sensor.

The system controller can determine a difference in the base-emitter voltages, and to generate the bandgap reference voltage from the difference in the base-emitter voltages and at least one of the base-emitter voltages. The system controller can add the difference in the base-emitter voltages to one of the base-emitter voltages to generate the bandgap reference voltage. The system controller can multiply the difference in the base-emitter voltages to a constant value and then to add the multiplied difference in the base-emitter voltages to one of the base-emitter voltages to generate the bandgap reference voltage. The constant value can be based at least in part on characteristics of the bandgap temperature sensor.

The bandgap temperature sensor includes a variable current source to provide a first current to a transistor to generate a first base-emitter voltage signal, and to provide a second current to the transistor to generate a second base-emitter voltage signal. The device includes an analog-to-digital converter to convert base-emitter voltages into digital base-emitter voltage signals, the system controller to generate the bandgap voltage according to the digital base-emitter voltage signals.

A method includes detecting multiple base-emitter voltages generated by a bandgap temperature sensor, and generating a bandgap reference voltage according to the multiple base-emitter voltage signals, the bandgap reference voltage to remain substantially constant relative to environmental temperature variations.

The method can also include determining a difference in the base-emitter voltages, and generating the bandgap reference voltage from the difference in the base-emitter voltages and at least one of the base-emitter voltages.

The generating of the bandgap reference voltage can include adding the difference in the base-emitter voltages to one of the base-emitter voltages. The generating of the bandgap reference voltage can include multiplying the difference in the base-emitter voltages to a constant value, and adding the multiplied difference in the base-emitter voltages to one of the base-emitter voltages. The constant value can be based at least in part on the characteristics of the bandgap temperature sensor.

The method can include generating a first base-emitter voltage signal when a first current signal is provided to a transistor, generating a second base-emitter voltage signal when a second current signal is provided to the transistor, determining a difference between the first base-emitter voltage signal and the second base-emitter voltage signal, and generating the bandgap reference voltage based, at least in part, on the determined difference between the first base-emitter voltage signal and the second base-emitter voltage signal.

A system includes a memory to store computer-readable instructions, and a microprocessor to receive the instructions stored in memory, the instructions, when executed, cause the microprocessor to identify multiple base-emitter voltages generated by a bandgap temperature sensor, and generate a bandgap reference voltage according to the multiple base-emitter voltage signals, where the bandgap reference voltage having a voltage level that remains substantially constant relative to environmental temperature variations.

The microprocessor can determine a difference in the base-emitter voltages, and generate the bandgap reference voltage from the difference in the base-emitter voltages and at least one of the base-emitter voltages. The base-emitter voltages decrease as the environmental temperature increases, and the difference in the base-emitter voltages increases as the environment temperature increases. The microprocessor can add the difference in the base-emitter voltages to one of the base-emitter voltages to generate the bandgap reference voltage. The microprocessor can multiply the difference in the base-emitter voltages to a constant value, and add the multiplied difference in the base-emitter voltages to one of the base-emitter voltages to generate the bandgap reference voltage. The constant value can be based at least in part on the characteristics of the bandgap temperature sensor.

The bandgap temperature sensor can generate a first base-emitter voltage signal when a first current signal is provided to a transistor and to generate a second base-emitter voltage signal when a second current signal is provided to the transistor. The microprocessor can determine a difference between the first base-emitter voltage signal and the second base-emitter voltage signal, and generate the bandgap reference voltage based, at least in part, on the determined difference between the first base-emitter voltage signal and the second base-emitter voltage signal.

DESCRIPTION OF THE DRAWINGS

The invention can be best understood by reading the disclosure with reference to the drawings.

DETAILED DESCRIPTION

A bandgap voltage reference system includes a microprocessor or other controller to generate or numerically build a bandgap voltage reference according to base-emitter voltages detected in a bandgap temperature sensor. Due to the relationship between the base-emitter voltages and an environmental temperature, the bandgap voltage reference can be a temperature flat reference that remains relatively constant as the environmental temperature varies. Embodiments are shown and described below in greater detail.

Figure 1:
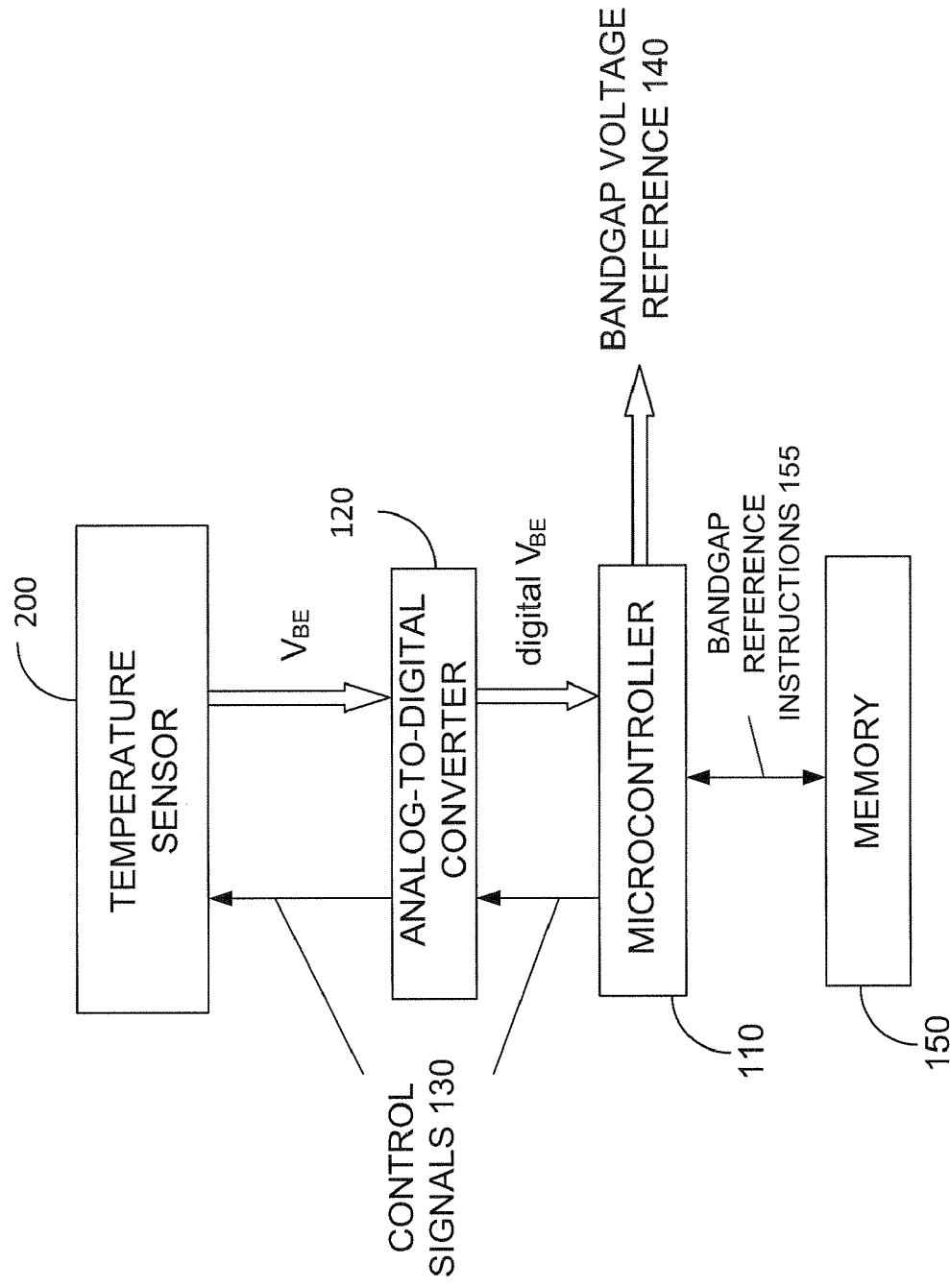
FIG. 1 is a block diagram of a bandgap voltage reference system according to embodiments of the invention.

FIG. 1 is a block diagram of a bandgap voltage reference system 100 according to embodiments of the invention. Referring to FIG. 1, the bandgap voltage reference system 100 includes a microcontroller 110 to generate, numerically build, or calculate a bandgap voltage reference 140 from multiple base-emitter voltages $V_{BE}$ generated by a temperature sensor 200. The bandgap voltage reference 140 can be a temperature flat reference, for example, having a voltage level that remains substantially constant when there are environmental temperature variations associated with the bandgap voltage reference system 100. In some embodiments, the microcontroller 110 can be a processor, microprocessor, or other controller device capable of generating the bandgap voltage reference 140, or be implemented in firmware, as a discrete set of hardware elements, state machine, or in an on board store, or off board store.

The temperature sensor 200 can generate multiple analog base-emitter voltages $V_{BE}$ signals, for example, by providing one or more currents to at least a pair of diodes having different current densities. The temperature sensor 200 can also generate the analog base-emitter voltage $V_{BE}$ signals by sequentially providing one current to a bipolar junction transistor to determine a first analog base-emitter voltage $V_{BE}$ signal and then providing a different current to the bipolar junction transistor to determine a second analog base-emitter voltage $V_{BE}$ signal. Embodiments of the temperature sensor 200 will be described below in greater detail.

The microcontroller 110 can detect or measure the multiple base-emitter voltage $V_{BE}$ signals generated by the temperature sensor 200, and generate the bandgap voltage reference 140 according to the multiple base-emitter voltage $V_{BE}$ signals. For instance, the microcontroller 110 can determine a difference between the multiple base-emitter voltage $V_{BE}$ signals, e.g., calculate a differential base-emitter voltage $\Delta V_{BE}$, and then add the differential base-emitter voltage $\Delta V_{BE}$ to at least one of the multiple base-emitter voltage $\Delta V_{BE}$ signals to generate the bandgap voltage reference 140.

Since the multiple base-emitter voltage $V_{BE}$ signals have a temperature profile where the voltage level decreases as temperature increases, and the differential base-emitter voltage $\Delta V_{BE}$ has a temperature profile where the voltage level increases as temperature increases, the microcontroller 110 can numerically build or calculate a bandgap voltage reference 140 that is insensitive to environmental temperature fluctuations by adding the differential base-emitter voltage $\Delta V_{BE}$ with at least one of the multiple base-emitter voltage $V_{BE}$ signals. In some embodiments, the microcontroller 110 can multiply the differential base-emitter voltage $\Delta V_{BE}$ with a constant value K, for example, according to the characteristics of the temperature sensor 200, prior to adding the adding the differential base-emitter voltage $\Delta V_{BE}$ with at least one of the multiple base-emitter voltage $V_{BE}$ signals. The microcontroller 110 can characterize or calibrate the constant value K, for example, during wafer tests or device testing. The constant value K can be stored in a memory 150 for use by the microcontroller 110 in the generation of the bandgap voltage reference 140.

The bandgap voltage reference system 100 includes an analog-to-digital converter 120 to convert the analog base-emitter voltage $V_{BE}$ signals into digital base-emitter voltage $V_{BE}$ signals and provide the digital base-emitter voltage $V_{BE}$ signals to the microcontroller 110. In some embodiments, the analog-to-digital converter 120 can be a passive converter, thus consuming less power and chip area compared with active converters.

The microcontroller 110 can generate a bandgap voltage reference 140 according to the digital base-emitter voltages $V_{BE}$. The microcontroller 110 can generate, calculate or numerically build the bandgap voltage reference 140 by determining a differential base-emitter voltage $\Delta V_{BE}$ from the multiple digital representations of base-emitter voltage $V_{BE}$ signals provided by the analog-to-digital converter 130, and then adding the differential base-emitter voltage $\Delta V_{BE}$ to at least one of the base-emitter voltages $V_{BE}$.

The microcontroller 110 can also utilize the differential base-emitter voltage $\Delta V_{BE}$ that it determines, and the fact that the differential base-emitter voltage $\Delta V_{BE}$ is proportional to an Absolute Temperature (PTAT) value, to sense an environmental temperature value. The microcontroller 110 can use a memory 150 or a look-up table (not shown) to determine the environmental temperature from the differential base-emitter voltage $\Delta V_{BE}$.

When more than two digital base-emitter voltage $V_{BE}$ signals are provided from the analog-to-digital converter 130, the microcontroller 110 can use any number of methods to determine the differential base-emitter voltage $\Delta V_{BE}$. For instance, the microcontroller 110 can find a difference from any two of the digital base-emitter voltage $V_{BE}$ signals and utilize the difference as the differential base-emitter voltage $\Delta V_{BE}$. In some embodiments, the microcontroller 110 can approximate the differential base-emitter voltage $\Delta V_{BE}$ from the digital base-emitter voltage $V_{BE}$ signals by averaging multiple differences of the between the digital base-emitter voltage $V_{BE}$ signals or by selecting one of the differences, such as the median difference, as the differential base-emitter voltage $\Delta V_{BE}$.

The microcontroller 110 can perform operations according to instructions, such as bandgap reference instructions 155, stored in the memory 150. The microcontroller 110 can receive the bandgap reference instructions 155 that, when executed, enable the microcontroller 110 to control the operation of the temperature sensor 200, detect multiple base-emitter voltage $V_{BE}$ signals, and generate the bandgap voltage reference 140 according to the detected base-emitter voltage $V_{BE}$ signals.

The microcontroller 110 can control operations of the temperature sensor 200 and the analog-to-digital converter 120 with control signals 130. For instance, the microcontroller 110 can select the number of base-emitter voltage $V_{BE}$ signals that are generated by the temperature sensor 200 by providing control signals 130 to the temperature sensor 200 via the analog-to-digital converter 120. In some embodiments, the analog-to-digital converter 120 can convert the control signals 130 from the microcontroller 110 into analog control signals 130 to control the temperature sensor 200. The microcontroller 110 can also control the operation, and/or timing of the analog-to-digital converter 120. Although FIG. 1 includes a temperature sensor 200, in some embodiments, any device that generates a base-emitter voltage can be used to determine the bandgap voltage reference 140.

Figure 2:
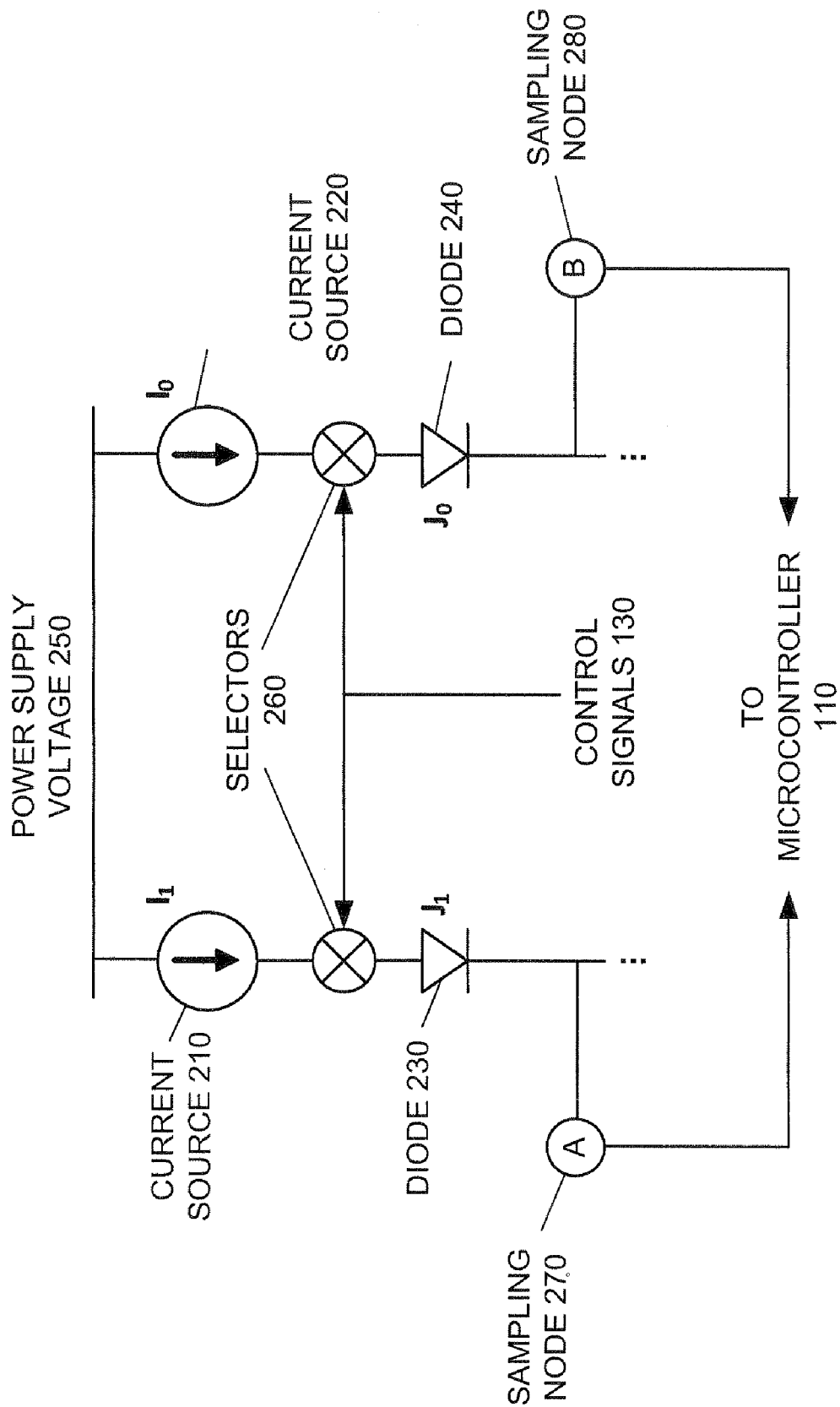
FIGS. 2 and 3 are block diagrams of embodiments of a temperature sensor shown in FIG. 1.
Figure 3:
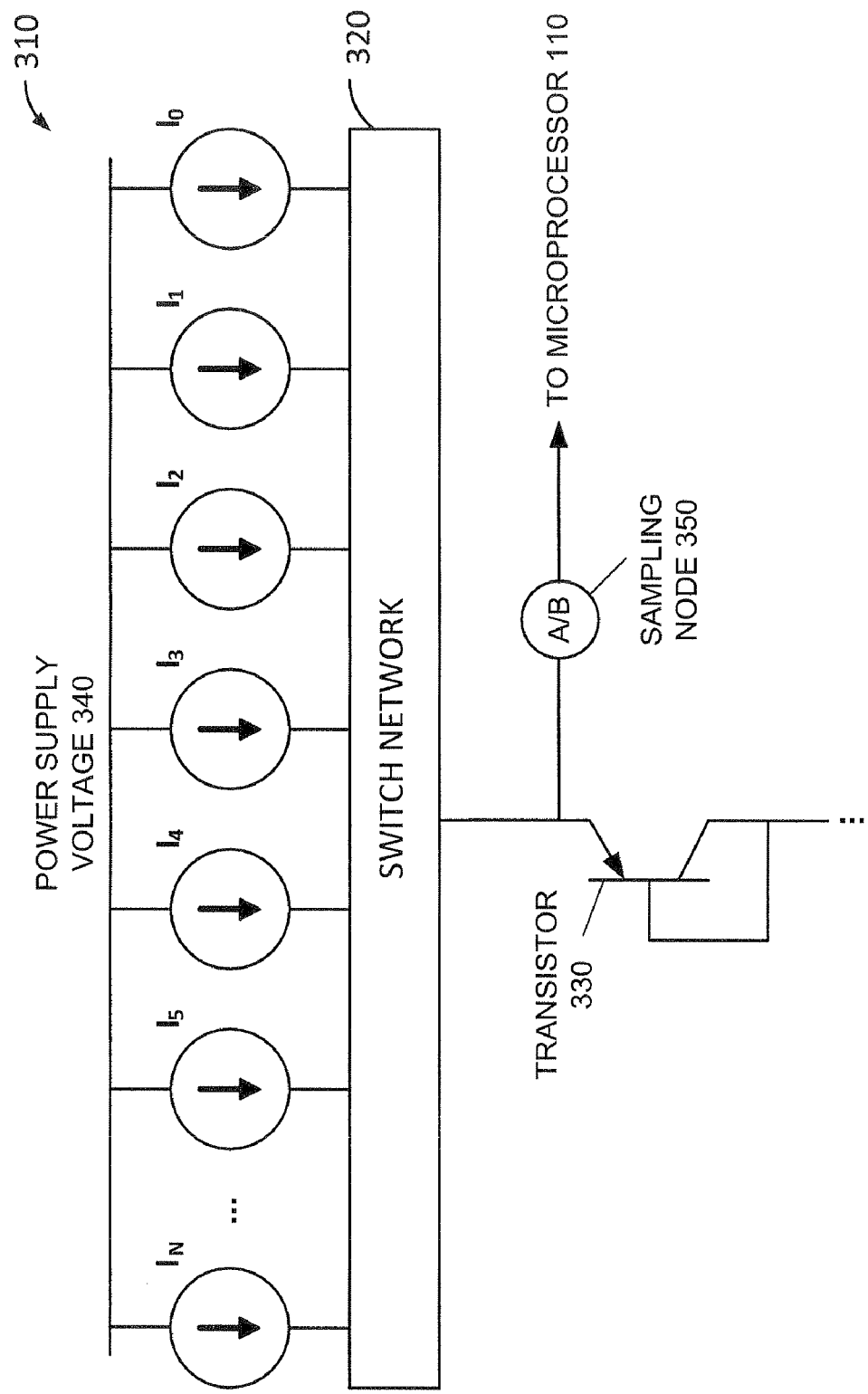

FIGS. 2 and 3 are block diagrams of embodiments of a temperature sensor shown in FIG. 1. Referring to FIG. 2, the temperature sensor 200 includes a pair of current sources 210 and 220 to provide respective currents $I_1$ and $I_0$ to a corresponding pair of diodes 230 and 240. The pair of diodes 230 and 240 can have base-emitter voltages $V_{BE}$ that correspond to the magnitude of current provided to it by the respective current sources 210 and 220. For instance, current source 210 can provide current $I_1$ to diode 230 with a current density $J_1$, and current source 220 can provide current $I_0$ to diode 240 with a current density $J_0$. The current sources 210 and 220 can generate the respective currents $I_1$ and $I_0$ according to a power supply voltage 250.

The diodes 230 and 240 generate base-emitter voltages responsive to receiving the currents $I_1$ and $I_0$ from the current sources 210 and 220, respectively. The base-emitter voltages can be measured, for example, by the microcontroller 110, at sampling nodes 270 and 280, shown as node A and node B, respectively. The measured or sampled base-emitter voltages from sampling nodes 270 and 280 can be transferred or provided to the microcontroller 110 for use in determining the bandgap voltage reference 140.

The temperature sensor 200 includes selectors 260 to selectively provide the currents $I_1$ and $I_0$ from the current sources 210 and 220 to the respective diodes 230 and 240. The selectors 260 can receive control signals 130 from the microcontroller 110 that prompt the selectors 260 to open blocking current being provided to at least one of the diodes 230 and 240, or close allowing current to reach at least one of the diodes 230 and 240. In some embodiments, the selectors 260 can be multiplexors that select between the currents $I_1$ and $I_0$ from the current sources 210 and 220, and another input, such as a ground voltage responsive to the control signals 130.

Referring to FIG. 3, the temperature sensor 300 can include a variable current source 310 to provide current to a transistor 330. The variable current source 310 can have a plurality of fixed current sources $I_0$-$I_N$ that can be coupled in a current mirror configuration. The variable current source 310 can include any number of fixed current sources capable of generating any magnitude of current. The transistor 330 can be a bipolar junction transistor having a base-emitter voltage $V_{BE}$ that corresponds to the magnitude of current provided to it by the variable current source 310.

The variable current source 310 provides current to the transistor 330, which generates an analog base-emitter voltage responsive to the current. This analog base-emitter voltage is then provided to the microcontroller 110 after conversion by analog-to-digital converter 120. The variable current source 310 can then provide another current, with a different magnitude, to the transistor 330, which generates another analog base-emitter voltage responsive to the new current. After receiving the new base-emitter voltage, the microcontroller 110 is capable of determining the differential base-emitter voltage and thus the environmental temperature for the system 100.

The variable current source 310 can generate and provide current to a switch network 320. The switch network 320 can be adapted to selectively couple the transistor 330 to the variable current source 310, or to one or more of the plurality of fixed current sources $I_0$-$I_N$.

The switch network 320 can provide current from the variable current source 310 to the transistor 330, which generates an analog base-emitter voltage $V_{BE}$. The analog base-emitter voltage $V_{BE}$ can be provided to the analog-to-digital converter 120 for conversion into a digital base-emitter voltage $V_{BE}$ signal. The digital base-emitter voltage $V_{BE}$ signal can be provided to the microcontroller 110 for further processing.

This process, of the variable current source 310 generating a current that is provided to the transistor 330 via the network switch 320, is then repeated with at least one different current magnitude. The number of base-emitter voltage $V_{BE}$ signals that the temperature sensor 300 generates and the currents utilized to generate them can be programmable or controllable depending on the resolution and granularity requirements for the bandgap voltage reference system 100.

In some embodiments, the one or more of the fixed current sources $I_0$-$I_N$ can be selected during the generation of a first base-emitter voltage, and subsequently select one or more of the fixed current sources $I_0$-$I_N$ during the generation of a second or any other base-emitter voltage. A current ratio larger than 1 can be maintained between the current utilized to generate the first base-emitter voltage and at least one of the second or subsequent base-emitter voltages. This current ratio can ensure the temperature sensing system 100 determines a large $\Delta V_{BE}$, and thus generates a linear variation in temperature.

The temperature sensor 300 includes a sampling node 350, shown as a combined node A/B. The microcontroller 110 can measure or sample the base-emitter voltages at the sampling node 350 after a selected current is provided to the transistor 330. In some embodiments, the measured or sampled base-emitter voltages from sampling node 350 can be transferred or provided to the microcontroller 110 for use in determining the bandgap voltage reference 140.

Figure 4:
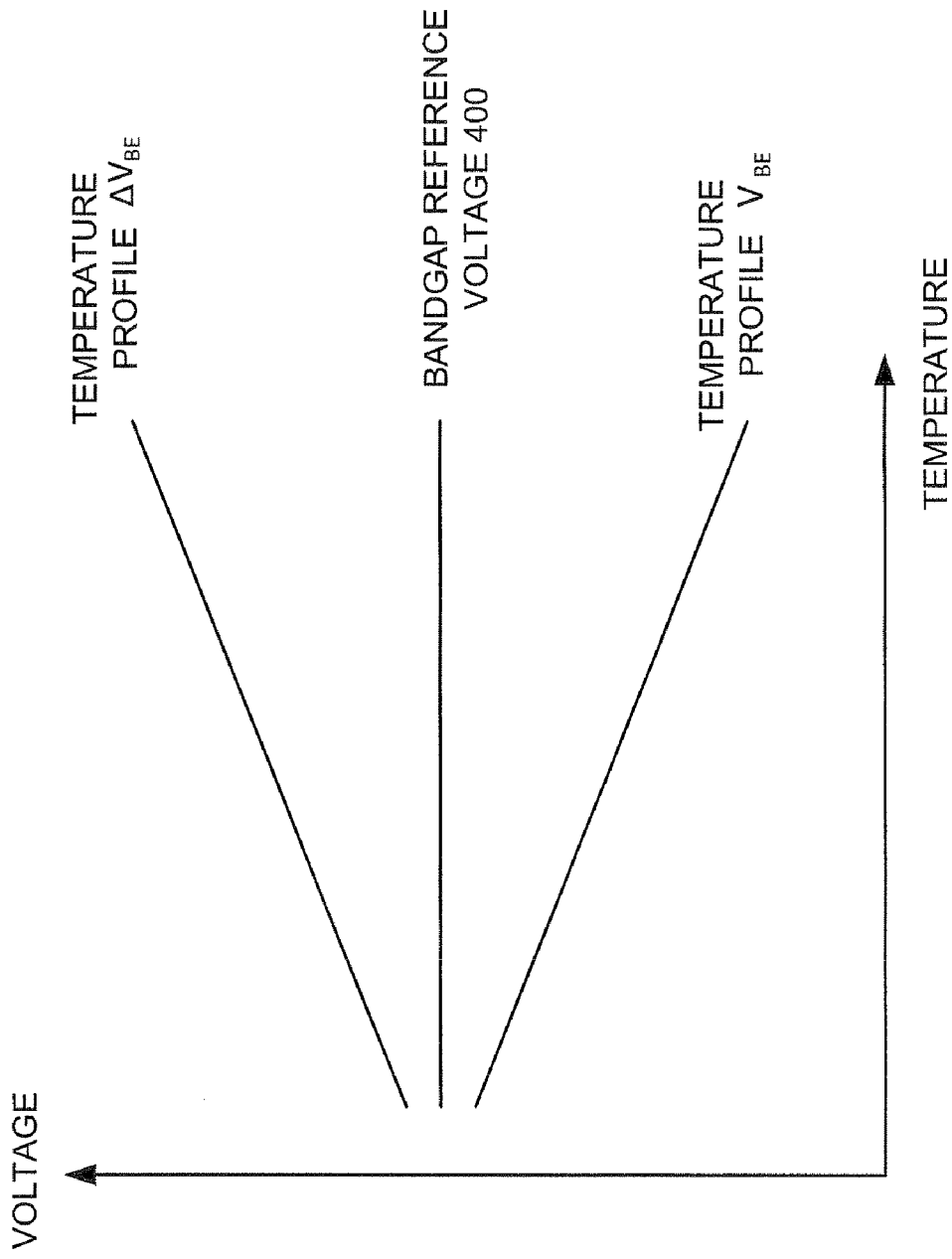
FIG. 4 is an example chart illustrating a relationship between environmental temperature and voltages of the bandgap voltage reference system shown in FIG. 1.

FIG. 4 is an example chart illustrating a relationship between environmental temperature and base-emitter voltages of the bandgap voltage reference system 100 shown in FIG. 1. Referring to FIG. 4, the chart shows temperature profiles for base-emitter voltages $V_{BE}$, differential base emitter voltages $\Delta V_{BE}$, and the bandgap reference voltage 140. The base-emitter voltages $V_{BE}$ generated by the temperature sensor 200 (or 300) have a temperature profile where their voltage level decreases as an environmental temperature increases. The differential base-emitter voltage $\Delta V_{BE}$ has a temperature profile with a voltage level increasing as the environmental temperature increases. The bandgap voltage reference 140 can be a temperature flat reference, or having a voltage level that remains substantially constant over a temperature range. In some embodiments, the microcontroller 110 can generate the bandgap voltage reference 140 by adding the differential base-emitter voltage $\Delta V_{BE}$, or a multiple thereof, with at least one of the base-emitter voltages $V_{BE}$.

Figure 5:
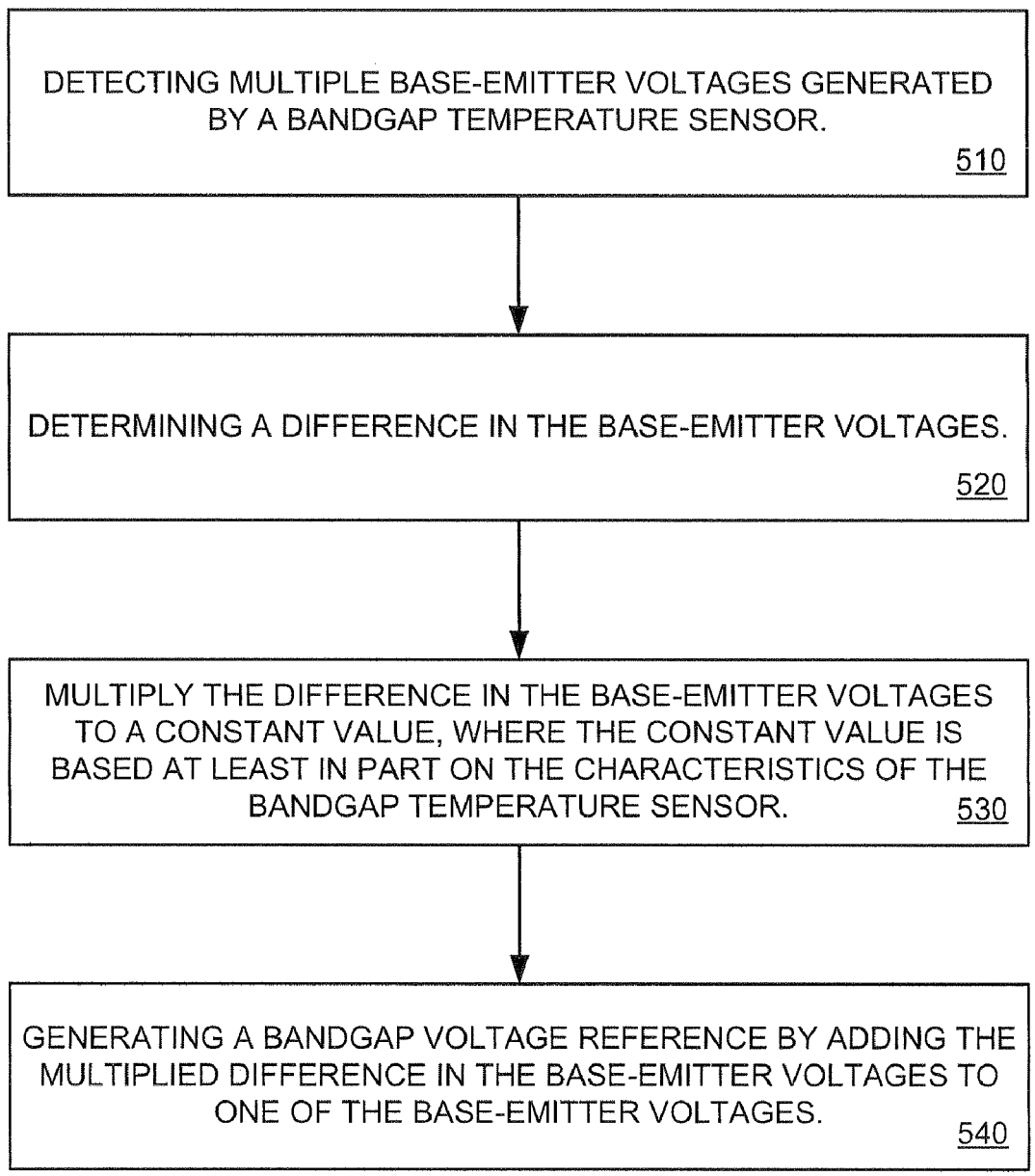
FIG. 5 is an example flowchart of the bandgap voltage reference system shown in FIG. 1.

FIG. 5 is an example flowchart of the bandgap voltage reference system shown in FIG. 1. Referring to FIG. 5, the flowchart begins at block 510 by detecting multiple base-emitter voltages $V_{BE}$ generated by a bandgap temperature sensor. In some embodiments, the band gap temperature sensor can generate multiple analog base-emitter voltages $V_{BE}$, for example, by providing one or more currents to at least a pair of diodes having different current densities. The temperature sensor can also generate the analog base-emitter voltage $V_{BE}$ signals by sequentially providing one current to a bipolar junction transistor to determine a first analog base-emitter voltage $V_{BE}$ signal and then providing a different current to the bipolar junction transistor to determine a second analog base-emitter voltage $V_{BE}$ signal.

In some embodiments, the microcontroller 110 can detect or measure a voltage level of the base-emitter voltages $V_{BE}$ generated by the temperature sensor. The detected base-emitter voltages $V_{BE}$ can be provided to the microcontroller 110 from the temperature sensor, for example, via an analog-to-digital converter 120. The analog-to-digital converter 120 can convert the base-emitter voltages $V_{BE}$ to digital representations of the base-emitter voltages $V_{BE}$ and provide them to the microcontroller 110.

The flowchart continues to block 520 and determines a difference in the base-emitter voltages. In some embodiments, the microcontroller 110 can determine the difference between multiple base-emitter voltages $V_{BE}$ to generate a differential base-emitter voltage $\Delta V_{BE}$. The number of base-emitter voltage $V_{BE}$ the microcontroller 110 utilizes to generate the differential base-emitter voltage $\Delta V_{BE}$ can be variable. For instance, the microcontroller 110 can generate the differential base-emitter voltage $\Delta V_{BE}$ by determining a difference between two base-emitter voltages $V_{BE}$.

The flowchart continues to block 530 and multiplies the difference in the base-emitter voltages to a constant value K. The constant value K can be based at least in part on the characteristics of the bandgap temperature sensor. In some embodiments, the constant value K is around 20, which can be proportional to the voltage levels of the differential base-emitter voltage $\Delta V_{BE}$ and base-emitter voltages $V_{BE}$. The microcontroller 110 can characterize or calibrate the constant value K, for example, during wafer tests or device testing. The constant value K can be stored in a memory 150 for use by the microcontroller 110 in the generation of the bandgap voltage reference 140.

The flowchart continues to block 540 and generates a bandgap voltage reference 140 by adding the difference in the base-emitter voltages $\Delta V_{BE}$ multiplied by the constant value K to at least one of the base-emitter voltages $V_{BE}$. The bandgap voltage reference 140 can be a temperature flat reference, e.g., having a voltage level that remains substantially constant relative to environmental temperature variations.

Although FIG. 5 discloses a microcontroller 110 capable of performing the operations in the flowchart, in some embodiments, any controller can perform one or more of the flowchart operations. In some embodiments, the controller can be a processor, microprocessor, firmware, a discrete set of hardware elements, state machine, on-board or off-board store, or other controller device capable of generating the bandgap voltage reference 140. FIG. 5 also discloses utilizing temperature sensor 200 to generate the base-emitter voltages, however, in some embodiments, any device can generate the base-emitter voltages used to determine the bandgap voltage reference 140.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure.

The preceding embodiments are exemplary. Although the specification can refer to "an", "one", "another", or "some" embodiment(s) in several locations, this does not necessarily mean that each such reference is to the same embodiment(s), or that the feature only applies to a single embodiment.

The invention claimed is:

1. A device comprising:
 a bandgap temperature sensor configured to generate a selected number of base-emitter voltages responsive to receiving a request to generate the selected number of base-emitter voltages; and
 a system controller configured to:
  select the number of selected base-emitter voltages to be generated responsive to a desired resolution of a bandgap reference voltage,
  receive the selected number of base-emitter voltages generated by the bandgap temperature sensor, and
  generate the bandgap reference voltage according to the selected number of base-emitter voltages, the bandgap reference voltage remaining substantially constant relative to a temperature associated with the bandgap temperature sensor.

2. The device of claim 1, wherein the system controller is further configured to determine at least one difference in the selected number of base-emitter voltages, and to generate the bandgap reference voltage from the at least one difference in the selected number of base-emitter voltages and at least one of the selected number of base-emitter voltages.

3. The device of claim 2, wherein the system controller is further configured to add the at least one difference in the selected number of base-emitter voltages to one of the selected number of base-emitter voltages to generate the bandgap reference voltage.

4. The device of claim 3, wherein the system controller is further configured to multiply the at least one difference in the base-emitter voltages to a constant value and to add a multiplied difference to one of the selected number of base-emitter voltages to generate the bandgap reference voltage.

5. The device of claim 4, wherein the constant value is based at least in part on a measured characteristic of the bandgap temperature sensor.

6. The device of claim 1 wherein the bandgap temperature sensor includes a variable current source configured to provide a first current to a transistor to generate a first base emitter voltage, and to provide a second current to the transistor to generate a second base-emitter voltage.

7. The device of claim 1, further comprising an analog-to-digital converter configured to convert the selected number of base emitter voltages into digital base-emitter voltage signals, wherein the system controller is configured to generate the bandgap voltage responsive to the digital base-emitter voltage signals.

8. A method comprising:
 detecting a selected number of base-emitter voltages generated by a bandgap temperature sensor, the selected number of base-emitter voltages controllable in relation to a desired resolution or granularity of a bandgap reference voltage; and
 generating the bandgap reference voltage according to the selected number of base-emitter voltages, the bandgap reference voltage remaining substantially constant relative to environmental temperature variations of the bandgap temperature sensor.

9. The method of claim 8, further comprising:
 determining a difference in the selected number of base-emitter voltages; and
 generating the bandgap reference voltage from the difference in the selected number of base-emitter voltages and at least one of the selected number of base-emitter voltages.

10. The method of claim 9, wherein the generating the bandgap reference voltage includes adding the difference in the selected number of base-emitter voltages to one of the selected number of base-emitter voltages.

11. The method of claim 10, wherein the generating the bandgap reference voltage includes:
 multiplying the difference in the selected number of base-emitter voltages with a constant value; and
 adding the multiplied difference to one of the selected number of base emitter voltages.

12. The method of claim 11, wherein the constant value is based at least in part on a measured characteristic of the bandgap temperature sensor.

13. The method of claim 8, further comprising:
generating a first base-emitter voltage responsive to a first current being provided to a transistor;
generating a second base-emitter voltage responsive to a second current being provided to the transistor;
determining a difference between the first base-emitter voltage and the second base-emitter voltage; and
generating the bandgap reference voltage based, at least in part, on the determined difference between the first base-emitter voltage and the second base-emitter voltage.

14. A system comprising:
a memory configured to store computer-executable instructions; and
a microprocessor configured to execute the computer-executable instructions stored in the memory, the computer-executable instructions when executed by the microprocessor, cause the microprocessor to:
receive a selected number of base-emitter voltages generated by a bandgap temperature sensor, the selected number of base-emitter voltages controllable in relation to a desired resolution of a bandgap reference voltage; and
generate the bandgap reference voltage responsive to the selected number of base-emitter voltages, the bandgap reference voltage remaining substantially constant relative to environmental temperature variations of the bandgap temperature sensor.

15. The system of claim 14, wherein the microprocessor is operable to determine a difference in the selected number of base-emitter voltages, and generate the bandgap reference voltage from the difference in the selected number of base-emitter voltages and at least one of the selected number of base-emitter voltages.

16. The system of claim 15 wherein the base-emitter voltages decrease as the environmental temperature increases, and the difference increases as the environment temperature increases.

17. The system of claim 15, wherein the microprocessor is operable to add the difference in the selected number of base-emitter voltages to one of the selected number of base-emitter voltages to generate the bandgap reference voltage.

18. The system of claim 17, wherein the microprocessor is operable to multiply the difference in the selected number of base-emitter voltages to a constant, and add the multiplied difference in the selected number of base-emitter voltages to one of the selected number of base-emitter voltages to generate the bandgap reference voltage.

19. The system of claim 18, wherein the constant is determined based at least in part on a measured characteristic of the bandgap temperature sensor.

20. The system of claim 14, further comprising:
a bandgap temperature sensor configured to generate a first base-emitter voltage when a first current is provided to a transistor and to generate a second base-emitter voltage when a second current is provided to the transistor; and
wherein the microprocessor is caused to determine a difference between the first base-emitter voltage and the second base-emitter voltage, and generate the bandgap reference voltage using the determined difference between the first base-emitter voltage and the second base-emitter voltage.

* * * * *